(12) United States Patent
Sadaka et al.

(10) Patent No.: US 8,716,105 B2
(45) Date of Patent: May 6, 2014

(54) METHODS FOR BONDING SEMICONDUCTOR STRUCTURES INVOLVING ANNEALING PROCESSES, AND BONDED SEMICONDUCTOR STRUCTURES AND INTERMEDIATE STRUCTURES FORMED USING SUCH METHODS

(75) Inventors: Mariam Sadaka, Austin, TX (US); Ionut Radu, Crolles (FR); Didier Landru, Champ Pres Froges (FR)

(73) Assignee: Soitec, Bernin (FR)

( * ) Notice: Subject to any disclaimer, the term of this patent is extended or adjusted under 35 U.S.C. 154(b) by 259 days.

(21) Appl. No.: 13/076,745

(22) Filed: Mar. 31, 2011

(65) Prior Publication Data
US 2012/0252189 A1  Oct. 4, 2012

(51) Int. Cl.
*H01L 21/30* (2006.01)
*H01L 21/46* (2006.01)
*H01L 23/00* (2006.01)
*H01L 21/00* (2006.01)

(52) U.S. Cl.
CPC ..................................... *H01L 24/01* (2013.01)
USPC .................... 438/455; 438/107; 257/E21.567

(58) Field of Classification Search
CPC . H01L 23/485; H01L 23/49; H01L 23/49513; H01L 24/01; H01L 24/02; H01L 24/80; H01L 24/82
USPC .......................... 438/107–109, 118, 119, 455; 257/E21.567
See application file for complete search history.

(56) References Cited

U.S. PATENT DOCUMENTS

| 2005/0003664 A1 | 1/2005 | Ramanathan et al. |
| 2005/0104216 A1 | 5/2005 | Cabral et al. |
| 2006/0234473 A1 | 10/2006 | Wong et al. |
| 2007/0018332 A1* | 1/2007 | Ueno ............................. 257/774 |
| 2007/0284409 A1* | 12/2007 | Kobrinsky et al. ........... 228/44.7 |
| 2008/0041517 A1 | 2/2008 | Moriceau |
| 2010/0210108 A1* | 8/2010 | Ishizaka et al. ............... 438/674 |

FOREIGN PATENT DOCUMENTS

FR   2872625 A1   1/2006

OTHER PUBLICATIONS

French Preliminary Search Report and Written Opinion for French Application No. FR1153081 dated Jan. 24, 2012, 9 pages.
Gambino et al., Yield and Reliability of Cu Capped with CoWP Using a Self-Activated Process, IEEE, Interconnect Technology Conference, 2006, ISBN: 1-4244-0103-8, pp. 30-32.
Gan et al., Effect of passivation on stress relaxation in electroplated copper films, J. Mater. Res., vol. 21, No. 6, Jun 2006 © 2006 Materials Research Society, pp. 1512-1518.

* cited by examiner

*Primary Examiner* — Calvin Choi
(74) *Attorney, Agent, or Firm* — TraskBritt

(57) ABSTRACT

Methods of bonding together semiconductor structures include annealing metal of a feature on a semiconductor structure prior to directly bonding the feature to a metal feature of another semiconductor structure to form a bonded metal structure, and annealing the bonded metal structure after the bonding process. The thermal budget of the first annealing process may be at least as high as a thermal budget of a later annealing process. Additional methods involve forming a void in a metal feature, and annealing the metal feature to expand the metal of the feature into the void. Bonded semiconductor structures and intermediate structures are formed using such methods.

28 Claims, 12 Drawing Sheets

METHODS FOR BONDING SEMICONDUCTOR STRUCTURES INVOLVING ANNEALING PROCESSES, AND BONDED SEMICONDUCTOR STRUCTURES AND INTERMEDIATE STRUCTURES FORMED USING SUCH METHODS

TECHNICAL FIELD

Embodiments of the present disclosure relate to methods of bonding together semiconductor structures, and to bonded semiconductor structures and intermediate structures formed using such methods.

BACKGROUND

The three-dimensional (3D) integration of two or more semiconductor structures can produce a number of benefits to microelectronic applications. For example, 3D integration of microelectronic components can result in improved electrical performance and power consumption while reducing the area of the device footprint. See, for example, P. Garrou et al., "The Handbook of 3D Integration," Wiley-VCH (2008).

The 3D integration of semiconductor structures may take place by the attachment of a semiconductor die to one or more additional semiconductor dies (i.e., die-to-die (D2D)), a semiconductor die to one or more semiconductor wafers (i.e., die-to-wafer (D2W)), as well as a semiconductor wafer to one or more additional semiconductor wafers (i.e., wafer-to-wafer (W2W)), or a combination thereof.

The bonding techniques used in bonding one semiconductor structure to another semiconductor structure may be categorized in different ways, one being whether a layer of intermediate material is provided between the two semiconductor structures to bond them together and the second being whether the bonding interface allows electrons (i.e., electrical current) to pass through the interface. So called "direct bonding methods" are methods in which a direct solid-to-solid chemical bond is established between two semiconductor structures to bond them together without using an intermediate bonding material between the two semiconductor structures to bond them together. Direct metal-to-metal bonding methods have been developed for bonding metal material at a surface of a first semiconductor structure to metal material at a surface of a second semiconductor structure.

Direct metal-to-metal bonding methods may also be categorized by the temperature range in which each is carried out. For example, some direct metal-to-metal bonding methods are carried out at relatively high temperatures resulting in at least partial melting of the metal material at the bonding interface. Such direct bonding processes may be undesirable for use in bonding processed semiconductor structures that include one or more device structures, as the relatively high temperatures may adversely affect the earlier formed device structures.

"Thermo-compression bonding" methods are bonding methods in which pressure is applied between the bonding surfaces at elevated temperatures between two hundred degrees Celsius (200° C.) and about five hundred degrees Celsius (500° C.), and often between about three hundred degrees Celsius (300° C.) and about four hundred degrees Celsius (400° C.).

Additional direct bonding methods have been developed that may be carried out at temperatures of two hundred degrees Celsius (200° C.) or less. Such direct bonding processes carried out at temperatures of two hundred degrees Celsius (200° C.) or less are referred to herein as "ultra-low temperature" direct bonding methods. Ultra-low temperature direct bonding methods may be carried out by careful removal of surface impurities and surface compounds (e.g., native oxides), and by increasing the area of intimate contact between the two surfaces at the atomic scale. The area of intimate contact between the two surfaces is generally accomplished by polishing the bonding surfaces to reduce the surface roughness up to values close to the atomic scale, by applying pressure between the bonding surfaces resulting in plastic deformation, or by both polishing the bonding surfaces and applying pressure to attain such plastic deformation.

Some ultra-low temperature direct bonding methods may be carried out without applying pressure between the bonding surfaces at the bonding interface, although pressure may be applied between the bonding surfaces at the bonding interface in other ultra-low temperature direct bonding methods in order to achieve suitable bond strength at the bonding interface. Ultra-low temperature direct bonding methods in which pressure is applied between the bonding surfaces are often referred to in the art as "surface assisted bonding" or "SAB" methods. Thus, as used herein, the terms "surface assisted bonding" and "SAB" mean and include any direct bonding process in which a first material is directly bonded to a second material by abutting the first material against the second material and applying pressure between the bonding surfaces at the bonding interface at a temperature of two hundred degrees Celsius (200° C.) or less.

Direct metal-to-metal bonds between active conductive features in semiconductor structures may, in some instances, be prone to mechanical failure or electrical failure after a period of time even though an acceptable direct metal-to-metal bond may be initially established between the conductive features of the semiconductor structures. Although not fully understood, it is believed that such failure may be at least partially caused by one or more of three related mechanisms. The three related mechanisms are strain localization, which may be promoted by large grains, deformation-associated grain growth, and mass transport at the bonding interface. Such mass transport at the bonding interface may be at least partially due to electromigration, phase segregation, etc.

Electromigration is the migration of metal atoms in a conductive material due to an electrical current. Various methods for improving the electromigration lifetime of interconnects have been discussed in the art. For example, methods for improving the electromagnetic lifetime of copper interconnects are discussed in J. Gambino et al., "Copper Interconnect Technology for the 32 nm Node and Beyond," IEEE 2009 Custom Integrated Circuits Conference (CICC), pages 141-148.

BRIEF SUMMARY

This summary is provided to introduce a selection of concepts in a simplified foam, which concepts are further described in the detailed description below of some example embodiments of the disclosure. This summary is not intended to identify key features or essential features of the claimed subject matter, nor is it intended to be used to limit the scope of the claimed subject matter.

In some embodiments, the present disclosure includes methods of directly bonding a first semiconductor structure to a second semiconductor structure. In accordance with such methods, metal may be deposited over a first semiconductor structure. A portion of the metal deposited over the first semiconductor structure may be removed, and a remaining portion of the metal deposited over the first semiconductor structure may be subjected to a first thermal budget to anneal the remaining portion of the metal deposited over the first semiconductor structure. At least one metal feature of the first semiconductor structure that comprises the remaining portion of the metal deposited over the first semiconductor structure may be directly bonded to at least one metal feature of a second semiconductor structure to form a bonded metal structure that includes the at least one metal feature of the first semiconductor structure and the at least one metal feature of the second semiconductor structure. The bonded metal structure may be subjected to a second thermal budget to anneal the bonded metal structure. The second thermal budget to which the bonded metal structure is subjected may be less than the first thermal budget.

In additional embodiments of methods of directly bonding a first semiconductor structure to a second semiconductor structure, metal may be deposited over a first semiconductor structure, after which a portion of the metal deposited over the first semiconductor structure may be removed. A remaining portion of the metal deposited over the first semiconductor structure may be subjected to a first thermal budget to anneal the remaining portion of the metal deposited over the first semiconductor structure. An additional portion of the metal deposited over the first semiconductor structure may be removed after annealing the remaining portion of the metal deposited over the first semiconductor structure. At least one metal feature of the first semiconductor structure comprising a remaining portion of the metal deposited over the first semiconductor structure may be directly bonded to at least one metal feature of a second semiconductor structure to form a bonded metal structure that includes the at least one metal feature of the first semiconductor structure and the at least one metal feature of the second semiconductor structure. The bonded metal structure may be subjected to a second thermal budget to anneal the bonded metal structure. The second thermal budget may be less than the first thermal budget.

In additional embodiments of methods of directly bonding a first semiconductor structure to a second semiconductor structure, the direct bonding process may be performed at temperatures greater than or equal to about 20° C. (e.g. room temperature). At least one metal feature of the first semiconductor structure comprising a remaining portion of the metal deposited over the first semiconductor structure may be subjected to a bonding temperature between about 20° C. and 400° C.

In yet further embodiments of methods of directly bonding a first semiconductor structure to a second semiconductor structure, a metal may be deposited over a first semiconductor structure and at least one void may be formed in the metal. At least one metal feature of the first semiconductor structure comprising a portion of the metal may be directly bonded to at least one metal feature of a second semiconductor structure to form a bonded metal structure that includes the at least one metal feature of the first semiconductor structure and the at least one metal feature of the second semiconductor structure. The bonded metal structure may be annealed by subjecting the bonded metal structure to a post-bonding thermal budget, and the metal of the at least one metal feature of the first semiconductor structure may be caused to expand into a space previously occupied by the void in the metal.

Additional embodiments of the disclosure include bonded semiconductor structures fabricated in accordance with the methods described herein, and intermediate structures formed in accordance with the methods described herein.

For example, in additional embodiments, the present disclosure includes bonded semiconductor structures that comprise a first semiconductor structure having at least one metal feature, and a second semiconductor structure comprising at least one metal feature directly bonded to the at least one metal feature of the first semiconductor structure. The at least one metal feature of the first semiconductor structure having at least one inner surface defining a void within the at least one metal feature of the first semiconductor structure.

In yet further embodiments, the present disclosure includes intermediate structures formed during fabrication of bonded semiconductor structures. The intermediate structures comprise a first semiconductor structure having at least one metal feature and a bonding surface, and a second semiconductor structure comprising at least one metal feature having a bonding surface directly abutting the bonding surface of the at least one metal feature of the first semiconductor structure. By way of example and not limitation, the metal may comprise a metal or metal alloy such as copper, aluminum, nickel, tungsten, titanium or an alloy or mixture thereof. In some embodiments, the metal may be selected to comprise copper or a copper alloy.

BRIEF DESCRIPTION OF THE DRAWINGS

Embodiments of the present disclosure may be understood more fully by reference to the following detailed description of example embodiments of the present disclosure, which are illustrated in the appended figures in which.

DETAILED DESCRIPTION

Figure 1:
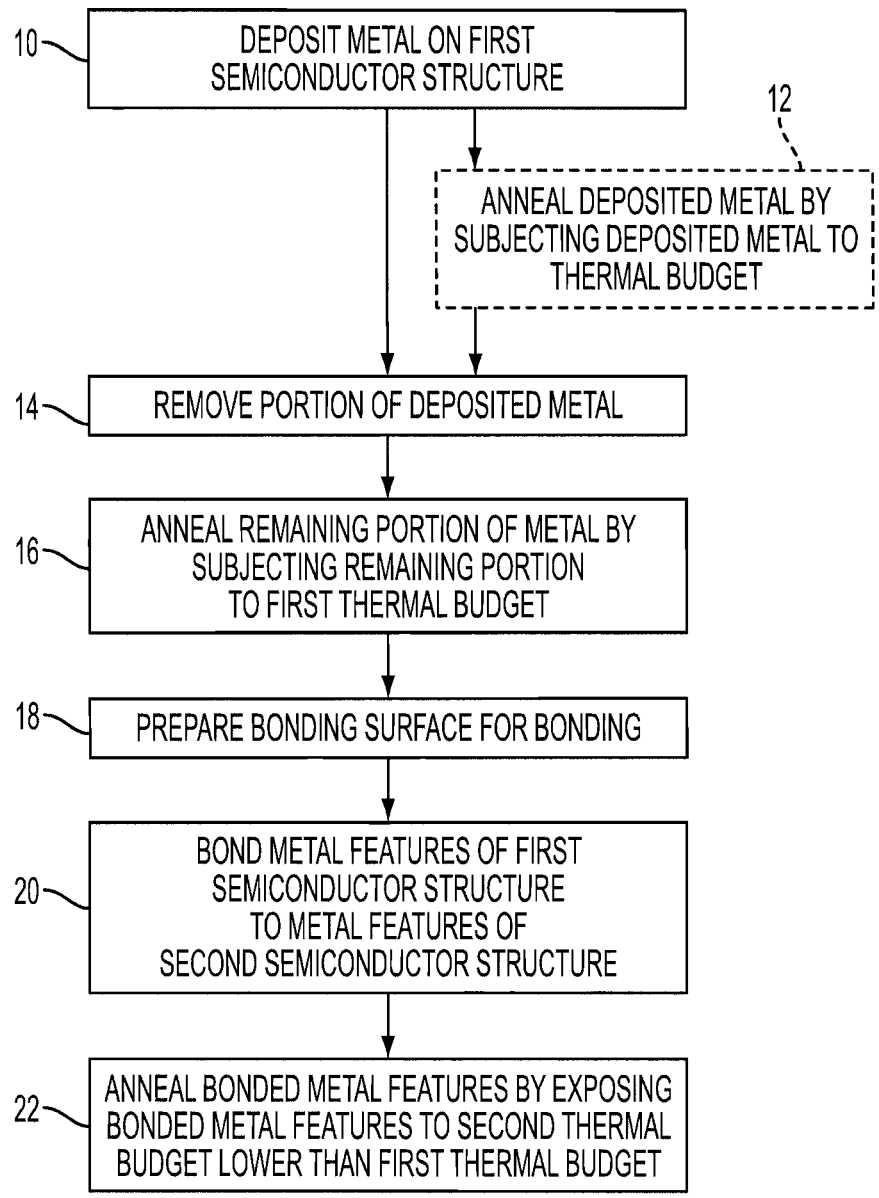
FIG. 1 is a flow chart illustrating a process flow of example embodiments of methods of forming bonded semiconductor structures of the disclosure.

The illustrations presented herein are not meant to be actual views of any particular material, device, system, or method, but are merely idealized representations that are used to describe embodiments of the disclosure.

Any headings used herein should not be considered to limit the scope of embodiments of the invention as defined by the claims below and their legal equivalents. Concepts described in any specific heading are generally applicable in other sections throughout the entire specification.

As used herein, the term "semiconductor structure" means and includes any structure that is used in the formation of a semiconductor device. Semiconductor structures include, for example, dies and wafers (e.g., carrier substrates and device substrates), as well as assemblies or composite structures that include two or more dies and/or wafers three-dimensionally integrated with one another. Semiconductor structures also include fully fabricated semiconductor devices, as well as intermediate structures formed during fabrication of semiconductor devices.

As used herein, the term "processed semiconductor structure" means and includes any semiconductor structure that includes one or more at least partially formed device structures. Processed semiconductor structures are a subset of semiconductor structures, and all processed semiconductor structures are semiconductor structures.

As used herein, the term "bonded semiconductor structure" means and includes any structure that includes two or more semiconductor structures that are attached together. Bonded semiconductor structures are a subset of semiconductor structures, and all bonded semiconductor structures are semiconductor structures. Furthermore, bonded semiconductor structures that include one or more processed semiconductor structures are also processed semiconductor structures.

As used herein, the term "device structure" means and includes any portion of a processed semiconductor structure that is, includes, or defines at least a portion of an active or passive component of a semiconductor device to be formed on or in the semiconductor structure. For example, device structures include active and passive components of integrated circuits such as transistors, transducers, capacitors, resistors, conductive lines, conductive vias, and conductive contact pads.

As used herein, the term "through wafer interconnect" or "TWI" means and includes any conductive via extending through at least a portion of a first semiconductor structure that is used to provide a structural and/or an electrical interconnection between the first semiconductor structure and a second semiconductor structure across an interface between the first semiconductor structure and the second semiconductor structure. Through wafer interconnects are also referred to in the art by other terms, such as "through silicon vias," "through substrate vias," "through wafer vias," or abbreviations of such terms, such as "TSVs" or "TWVs." TWIs typically extend through a semiconductor structure in a direction generally perpendicular to the generally flat, major surfaces of the semiconductor structure (i.e., in a direction parallel to the "Z" axis).

As used herein, the term "active surface," when used in relation to a processed semiconductor structure, means and includes an exposed major surface of the processed semiconductor structure that has been, or will be, processed to form one or more device structures in and/or on the exposed major surface of the processed semiconductor structure.

As used herein, the term "back surface," when used in relation to a processed semiconductor structure, means and includes an exposed major surface of the processed semiconductor structure on an opposing side of the processed semiconductor structure from an active surface of the semiconductor structure.

As used herein, the term "thermal budget," when used in relation to an annealing process, refers to the area under a line or curve graphing the temperature of the annealing process as a function of the time period over which the annealing process is conducted. In an annealing processes conducted at a single temperature (i.e., an isothermal annealing process), the thermal budget of the annealing process is simply the product of the temperature at which the annealing process is conducted and the length of time over which the annealing process is conducted.

In some embodiments, the present disclosure comprises improved methods of directly bonding a first semiconductor structure to a second semiconductor structure to form a bonded semiconductor structure. In particular, embodiments of the disclosure may comprise methods of forming direct metal-to-metal bonds between metal features of a first semiconductor structure and metal features of a second semiconductor structure, such that the strength, stability, and/or operational lifetime of the direct metal-to-metal bonds are improved relative to previously known methods.

In some embodiments, the direct metal-to-metal bonding methods of the disclosure may comprise non thermo-compression bonding methods performed at temperatures between approximately 20° C. and 400° C. to compensate for dishing of the bonding metal features.

Process flow of embodiments of methods of the present disclosure is illustrated in FIG. 1, and associated structures that may be formed in accordance with such a process flow are illustrated in FIGS. 2A-2G. The methods involve the direct bonding of a first semiconductor structure to a second semiconductor structure.

Figure 2A:
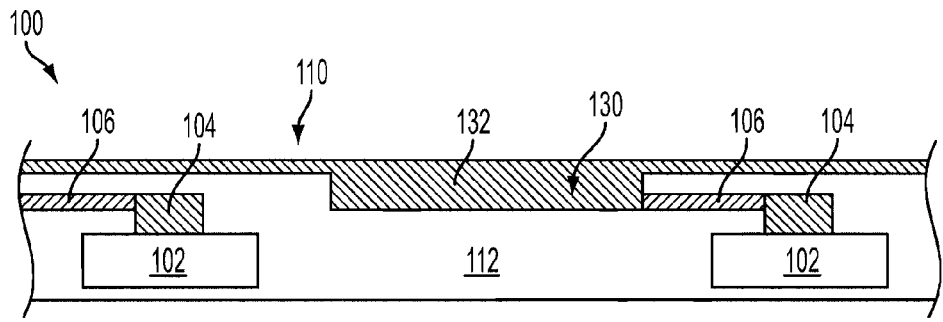
FIGS. 2A through 2G depict the formation of a bonded semiconductor structure in accordance with an embodiment of a method as illustrated in FIG. 1.

Referring to FIG. 1, in action 10, metal may be deposited over a first semiconductor structure. As shown in FIG. 2A, a first semiconductor structure 100 may be formed. The first semiconductor structure 100 may comprise a processed semiconductor structure, and may include one or more active device features, such as one or more of a plurality of transistors 102 (which are schematically represented in the figures), a plurality of vertically extending conductive vias 104, and a plurality of horizontally extending conductive traces 106. The active device features may comprise electrically conductive materials and/or semiconductor materials that are surrounded by a non-conductive bulk material 112 (e.g., an undoped bulk semiconductor material such as silicon, germanium, etc., or a dielectric material such as an oxide). By way of example and not limitation, one or more of the conductive vias 104 and the conductive traces 106 may comprise one or more conductive metals or metal alloys such as, for example, copper, aluminum, or an alloy or mixture thereof.

Figure 2B:
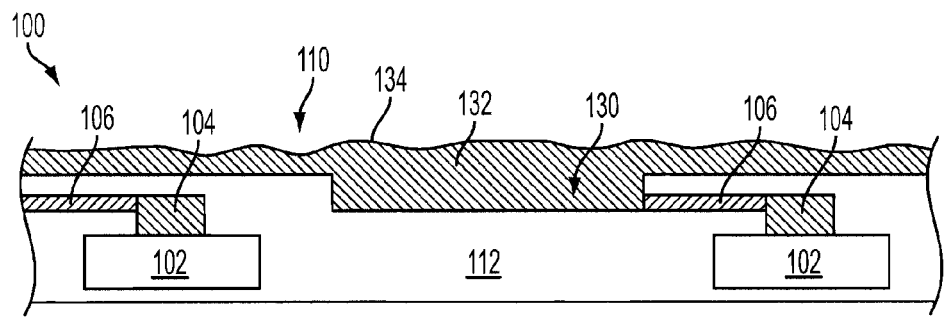
Figure 2C:
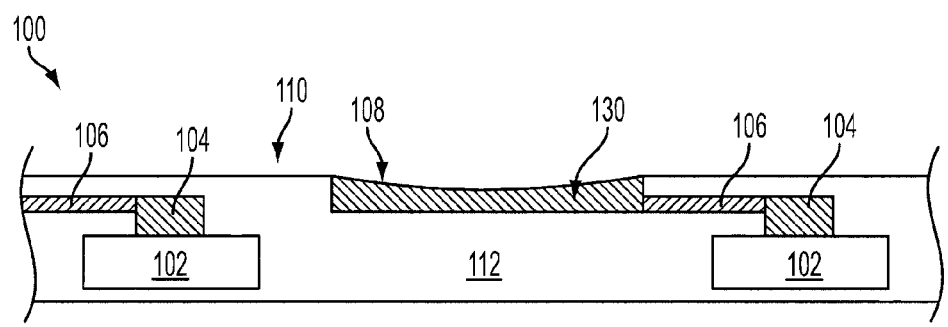

The first semiconductor structure 100 may also comprise a plurality of recesses 130 in which it is desired to form a plurality of bond pads 108 (FIG. 2C). To form the bond pads 108, metal 132 may be deposited over (e.g., onto) the active surface 110 of the first semiconductor structure 100, such that the metal 132 at least entirely fills the recesses 130 as shown in FIG. 2A. Excess metal 132 may be deposited onto the first semiconductor structure 100 such that the recesses 130 are entirely filled with the metal 132, and such that additional metal 132 is disposed over (e.g., covers) the active surface 110 of the first semiconductor structure 100. By way of example and not limitation, the metal 132 may comprise a metal or metal alloy such as copper, aluminum, nickel, tungsten, titanium or an alloy or mixture thereof. In some embodiments, the metal 132 may be selected to comprise copper or a copper alloy.

The metal 132 may be deposited onto the first semiconductor structure 100 using, for example, one or more of an electroless plating process, an electrolytic plating process, a sputtering process, a chemical vapor deposition (CVD) process, a physical vapor deposition (PVD) process, and an atomic layer deposition (ALD) process. As a non-limiting example, a seed layer of copper may be deposited using a chemical vapor deposition (CVD) process, after which additional copper may be deposited onto the seed layer of copper at a relatively faster rate using an electrochemical deposition (ECD) plating process.

Referring again to FIG. 1, in action 14, a portion of the deposited metal 132 (FIG. 2A) may be removed from the first semiconductor structure 100 to form bond pads 108 that comprise remaining portions of the deposited metal 132 disposed in the recesses 130, as shown in FIG. 2C. The portion of the deposited metal 132 may be removed in accordance with action 14 (FIG. 1) using, for example, an etching process (e.g., a wet chemical etching process, a dry reactive ion etching process, etc.), a polishing or grinding process, or combination thereof, such as a chemical-mechanical polishing (CMP) process. For example, the active surface 110 of the first semiconductor structure 100 may be subjected to a CMP process to remove portions of the deposited metal 132 (FIG. 2A) overlying areas of the bulk material 112 outside the recesses 130, such that only regions of the deposited metal 132 within the recesses 130 remain (which regions define and comprise the bond pads 108), and such that the bulk material 112 is exposed at the active surface 110 in the areas laterally adjacent the regions of the deposited metal 132 within the recesses 130. Thus, one or more of the bond pads 108 may be exposed at the active surface 110 of the first semiconductor structure 100.

As shown in FIG. 2C, the process used to remove excess metal 132 from the first semiconductor structure 100 (e.g., a CMP process) may result in the exposed surfaces of the bond pads 108 being recessed relative to the exposed bulk material 112 at the active surface 110. The exposed surfaces may have an arcuate, concave shape as shown in FIG. 2C. This phenomenon is often referred to in the art as "dishing." The dishing phenomenon may be relatively more pronounced in bond pads 108 that have larger exposed major surfaces relative to bond pads 108 that have smaller exposed major surfaces.

Referring again to FIG. 1, in action 16, the bond pads 108 (which comprise the remaining portion of the deposited metal 132) may be annealed by subjecting the first semiconductor structure 100, and, hence, the bond pads 108 comprising the remaining portion of the deposited metal 132) to a first thermal budget. In other words, the remaining portion of the deposited metal 132 that defines the bond pads 108 may be subjected to a first thermal budget to anneal the remaining portion of the metal 132. By way of example and not limitation, the remaining portion of the deposited metal 132 may be annealed by subjecting the remaining portion of the deposited metal 132 to an annealing temperature or temperatures below about 400° C. for an annealing time period of about two hours or less (e.g., between about thirty minutes (30 minutes) and about one hour (1 hour)).

In some embodiments, the annealing process of action 16 may be performed selectively across the active surface 110 of the first semiconductor structure 100 to compensate for any dishing of the bond pads 108 caused by the removal process of action 14, as discussed above. In such embodiments, the annealing process of action 16 may comprise a single wafer processing method such as a laser annealing process. In a laser annealing process a laser may be used to selectively anneal only bond pads 108 that have a "dished" concave bonding surface 109. Another example of selective annealing process of action 16 is using a hotplate or a heated wafer chuck with heating elements that can be individually and separately controlled.

It has been observed that copper films deposited by plating processes such as those mentioned above may undergo microstructural changes after deposition. Such microstructural changes may include recrystallization and/or grain growth. The recrystallization process can lead to changes in the spatial orientation of the grains. Such microstructural changes may lead to changes in electrical properties (e.g., electrical resistance) and/or physical properties (hardness) of the deposited copper films. The rate at which such microstructural changes occur may be temperature dependent, and may increase as the temperature of the copper films is increased.

As the parameters of subsequent processes to which the metal 132 is subjected, as well as the electrical performance and structural integrity of device structures ultimately formed from the metal 132, may be at least partially dependent upon the electrical properties and/or the physical properties of the metal 132, the metal 132 deposited onto the first semiconductor structure 100 in action 10 may be annealed in action 16 (FIG. 1) to induce and/or promote microstructural changes in the deposited metal 132 that might otherwise occur in the deposited metal 132 given sufficient time at room temperature, or upon exposure of the deposited metal 132 to elevated temperatures in subsequent processing. Through the annealing process of action 16, the microstructural changes in the deposited metal 132 may be induced to stabilize the microstructure of the deposited metal 132 (and, hence, the electrical properties and/or the physical properties of the deposited metal 132) prior to subjecting the first semiconductor structure 100 to subsequent processing, as discussed below.

Thus, in some embodiments, the annealing process of action 16 may comprise causing recrystallization of at least some grains within the metal 132. The recrystallization of the grains within the metal 132 may result in an alteration of an orientation of grains within the metal 132. Thus, in accordance with some embodiments, the various parameters of the thermal cycle of the annealing process of action 16 (e.g., the ramping up of the annealing temperature, the ramping down of the annealing temperature, the annealing time period, etc.) may be selected (e.g., optimized) to allow the formation of stable microstructures in the metal 132 prior to the bonding process, as described below.

Further, the recrystallization of grains within the metal 132 may further result in a change in at least one of an electrical property of the metal 132 and a physical property of the metal 132. For example, the annealing process of action 16 may result in a decrease in the electrical resistance of the metal 132 in at least one direction, such as the vertical direction from the perspective of FIG. 2D, which is transverse to the active surface 110 of the first semiconductor structure 100. As another example, the annealing process of action 16 may result in a decrease in the hardness of the metal 132.

Figure 2D:
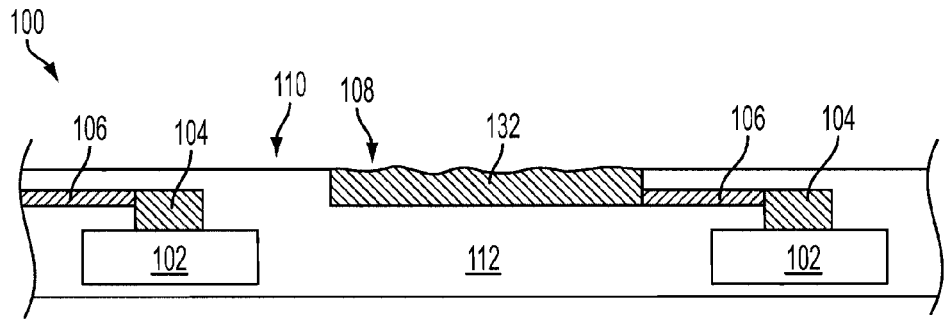

As shown in FIG. 2D, subjecting the remaining portion of the deposited metal 132 to the first thermal budget to anneal the metal 132 and induce microstructural changes therein may result in volumetric expansion (either locally, by, for example, grain reorientation and/or grain growth, or in bulk, by, for example, phase changes) of the deposited metal 132 and changes in the topography of the exposed surfaces of the bond pads 108, which define bonding surfaces 109 of the bond pads 108.

Referring to FIG. 1, in action 18, the bonding surfaces 109 of the bond pads 108 may be prepared for bonding. Action 18 may comprise, for example, one or more of a touch-up CMP process, a chemical treatment process, and a cleaning process. By way of example and not limitation, the bonding surfaces 109 of the bond pads 108 may be cleaned by first soaking the first semiconductor structure 100 in deionized water. In addition, ammonium hydroxide ($NH_4OH$) may be utilized as a post-CMP cleaning method. To prevent excessive copper roughening, the ammonium hydroxide ($NH_4OH$) clean may be utilized in combination with a copper corrosion inhibitor such as, for example, benzotriazole (BTA) or under a form that does not contain dissolved ammonia ($NH_3$) gas such as, for example, tetramethyl-ammonium hydroxide (TMAH).

With continued reference to FIG. 1, in action 20, the bond pads 108 may be directly bonded to metal features of a second semiconductor structure. An example of a direct bonding process that may be used to directly bond the bond pads 108 to metal features of a second semiconductor structure is described below with reference to FIGS. 2E through 2G.

Figure 2E:
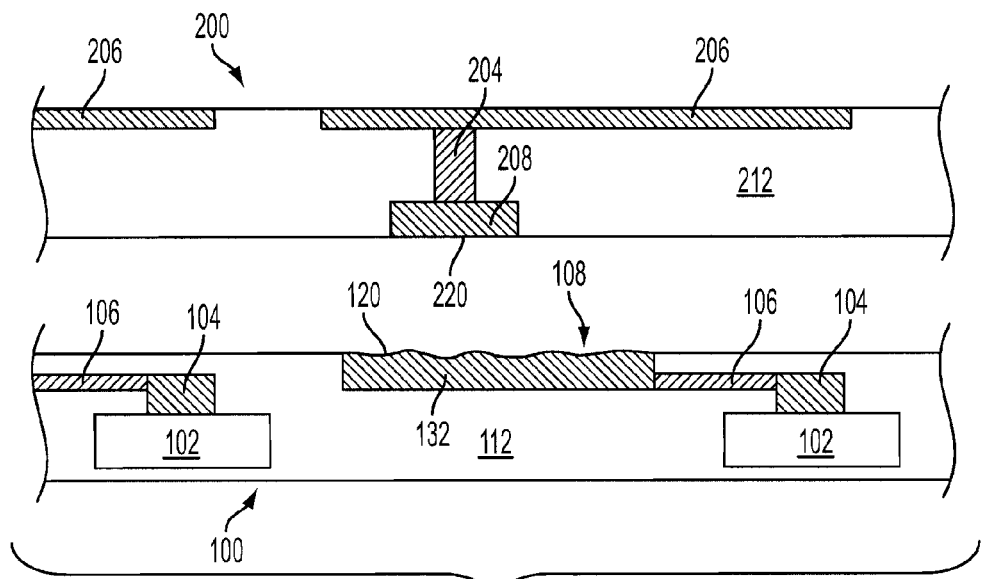

Referring to FIG. 2E, the first semiconductor structure 100 may be aligned with a second semiconductor structure 200 such that the bond pads 108 of the first semiconductor structure 100 are aligned with conductive metallic bond pads 208 of the second semiconductor structure 200. As shown in FIG. 2E, the second semiconductor structure 200 also may comprise a processed semiconductor structure, and may include additional active device structures, such as, for example, vertically extending conductive vias 204 and laterally extending conductive traces 206. Although not shown in the figures, the second semiconductor structure 200 also may comprise transistors.

Exposed surfaces of the bond pads 108 may define one or more bonding surfaces 120 of the bond pads 108, and exterior exposed surfaces of the bond pads 208 may define bonding surfaces 220 of the bond pads 208 of the second semiconductor structure 200.

Figure 2F:
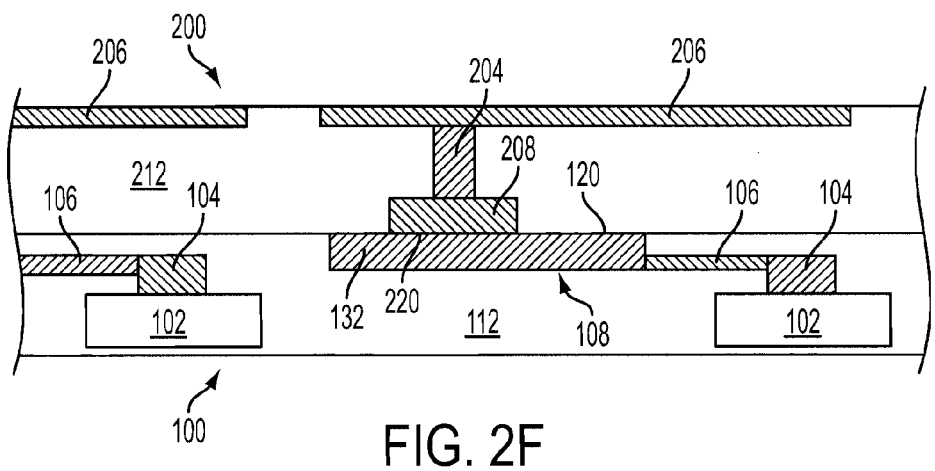

Referring to FIG. 2F, after aligning the first semiconductor structure 100 with a second semiconductor structure 200 such that the bond pads 108 of the first semiconductor structure 100 are aligned with the conductive metallic bond pads 208 of the second semiconductor structure 200, the first semiconductor structure 100 may be abutted against the second semiconductor structure 200 such that the bonding surfaces 120 of the bond pads 108 of the first semiconductor structure 100 are abutted directly against the bonding surfaces 220 of the bond pads 208 of the second semiconductor structure 200 without any intermediate bonding material (e.g., adhesive) therebetween.

Figure 2G:
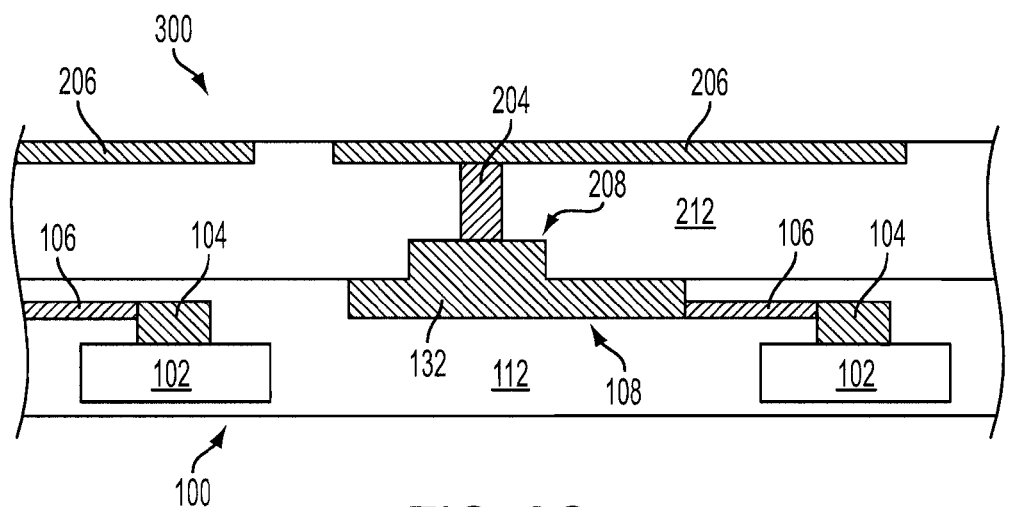

Referring to FIG. 2G, the bonding surfaces 120 of the bond pads 108 of the first semiconductor structure 100 then may be directly bonded to the bonding surfaces 220 of the bond pads 208 of the second semiconductor structure 200 (FIG. 2F) to form a bonded semiconductor structure 300. The bonding process results in the formation of bonded metal structures that include the bond pads 108 and the bond pads 208 that have been bonded together. The bonding surfaces 220 of the bond pads 208 of the second semiconductor structure 200 may be directly bonded to the bonding surfaces 120 of the bond pads 108 of the first semiconductor structure 100 in a direct metal-to-metal (e.g., copper-to-copper) non thermo-compression bonding process. In some embodiments, the non thermo-compression bonding process may comprise an ultra-low temperature direct bonding process carried out in an environment at a temperature or temperatures of about four hundred degrees Celsius (400° C.) or less, or even in an environment at a temperature or temperatures of about two hundred degrees Celsius (200° C.) or less. In some embodiments, the non thermo-compression bonding process may be carried out at a temperature or temperatures of between about twenty degrees Celsius (20° C.) and about four hundred degrees Celsius (400° C.), or even at a temperature or temperatures of between about two hundred degrees Celsius (200° C.) and about three hundred and fifty degrees Celsius (350° C.). In other embodiments, the non thermo-compression bonding process may be carried out in an environment at about room temperature (i.e., without any applied heat additional to that provided by the ambient environment).

Prior to bonding the first semiconductor structure 100 to the second semiconductor structure 200, the first semiconductor structure 100 and the second semiconductor structure 200 may be processed to remove surface impurities and undesirable surface compounds, and may be planarized to increase the area of intimate contact at the atomic scale between the bonding surfaces 120 of the bond pads 108 and the bonding surfaces 220 of the bond pads 208. The area of intimate contact between the bonding surfaces 120 and the bonding surfaces 220 may be accomplished by polishing the bonding surfaces 120 and the bonding surfaces 220 to reduce the surface roughness thereof up to values close to the atomic scale, by applying pressure between the bonding surfaces 120 and the bonding surfaces 220 resulting in plastic deformation, or by both polishing the bonding surfaces 120, 220 and applying pressure between the first semiconductor structure 100 and the second semiconductor structure 200 to attain such plastic deformation.

In some embodiments, the first semiconductor structure 100 may be directly bonded to the second semiconductor structure 200 without applying pressure between the bonding surfaces 120, 220 at the bonding interface therebetween, although pressure may be applied between the bonding surfaces 120, 220 at the bonding interface in some ultra-low temperature direct bonding methods in order to achieve a suitable bond strength at the bonding interface. In other words, the direct bonding methods used to bond the bond pads 108 of the first semiconductor structure 100 to the bond pads 208 of the second semiconductor structure 200 may comprise surface assisted bonding (SAB) bonding methods in some embodiments of the disclosure.

In some embodiments, the bond pads 108 and the bond pads 208 may differ in at least one of size and shape. More particularly, the bond pads 108 may have a first cross-sectional area in a plane parallel to the bonded interface between the bond pads 108 and the bond pads 208, and the bond pads 208 may have a second cross-sectional area in a plane parallel to the bonded interface between the bond pads 108 and the bond pads 208 that differs from the first cross-sectional area of the bond pads 108. In such embodiments, the bonding surfaces 120 of the bond pads 108 may have a first size, and the bonding surfaces 220 of the bond pads 208 may have a second size that is different from the first size. The bond pads 108 may have a first cross-sectional shape in a plane parallel to the bonded interface between the bond pads 108 and the bond pads 208, and the bond pads 208 may have a second cross-sectional shape in a plane parallel to the bonded interface between the bond pads 108 and the bond pads 208 that differs from the first cross-sectional shape of the bond pads 108. In such embodiments, the bonding surfaces 120 of the bond pads 108 may have a first shape, and the bonding surfaces 220 of the bond pads 208 may have a second shape that is different from the first shape. In embodiments in which the bonding surfaces 120 of the bond pads 108 and the bonding surfaces 220 of the bond pads 208 differ in shape, they may have the same or different sizes (i.e., the same or different areas).

In additional embodiments, the bonding surfaces 120 of the bond pads 108 and the bonding surfaces 220 of the bond pads 208 may have at least substantially the same size and shape. In such embodiments, the bond pads 108 and the bond pads 208 can, in some situations, be intentionally or unintentionally laterally misaligned with one another.

In embodiments wherein the bond pads are of different size and/or misaligned, attention should be given to the copper/oxide surfaces. The copper/oxide surfaces may be bonded prior to the post bonding anneal. In addition, the oxide may be covered/capped with a material; for example a dielectric, to ensure proper passivation that may suppress the thermo-mechanical behavior of the copper, this may be especially a concern for low dielectric constant (low-K) oxides. A non-limiting example of a method to reduce copper thermo-mechanical behavior is to ensure the copper is bonded to a dielectric surface (with e.g., a silicon nitride $Si_xN_y$) in the area of non-overlap with an addition copper pad (i.e., pad misalignment). In such embodiments the copper/silicon nitride surfaces may be bonded before annealing in order for the silicon nitride passivation to suppress thermo-mechanical behavior. For additional information, see for example "Effect of passivation on stress relaxation in electroplated copper films" Dongwen Gan and Paul S. Ho, Yaoyu Pang and Rui Huanga, Jihperng Leu, Jose Maiz, and Tracey Scherban, *J. Mater. Res.*, Vol. 21, No. 6, June 2006 © 2006 Materials Research Society.

Referring again to FIG. 1, in action 22, the bonded metal structures comprising the bond pads 108 and bond pads 208 may be annealed by exposing the bonded semiconductor structure 300 (and, hence, the bonded metal structures) to a second thermal budget. In some embodiments, the second thermal budget of action 22 may be less than the first thermal budget of action 16. In other words, the bonded metal structures may be subjected to a second thermal budget that is less than the first thermal budget to anneal the bonded metal structures. By way of example and not limitation, the bonded metal structures may be annealed by subjecting the bond pads 108 and the bond pads 208 to an annealing temperature or temperatures below about 400° C. for an annealing time period of about two hours or less (e.g., between about thirty minutes (30 minutes) and about one hour (1 hour)).

The annealing process of action 22 may, in some embodiments, be carried out in situ in a chamber or other enclosure in which the bonding process of action 20 is also conducted. In such embodiments, the annealing process of action 22 may comprise a later segment or portion of a continuous thermal cycle to which the first semiconductor structure 100 is subjected in the chamber or other enclosure.

As previously mentioned herein, the first thermal budget of the annealing process of action 16 may be greater than the second thermal budget of the annealing process of action 22. As the thermal budget is a function of both the annealing time period and the annealing temperature, the manner in which the first thermal budget of the annealing process of action 16 is rendered greater than the second thermal budget of the annealing process of action 22 may include varying the annealing temperatures, varying the annealing time periods, or varying both the annealing temperatures and the annealing time periods between the annealing process of action 16 and the annealing process of action 22.

In some embodiments, the annealing temperature or temperatures of the annealing process of action 22 may be at least substantially the same as the annealing temperature or temperatures of the annealing process of action 16. In such embodiments, the annealing time period of the annealing process of action 22 may be shorter than the annealing time period of the annealing process of action 16.

In additional embodiments, the annealing time period of the annealing process of action 22 may be at least substantially the same as the annealing time period of the annealing process of action 16. In such embodiments, the average annealing temperature of the annealing process of action 22 may be lower than the average annealing temperature of the annealing process of action 16.

In yet further embodiments, the annealing time period of the annealing process of action 22 may be shorter than the annealing time period of the annealing process of action 16, and the average annealing temperature of the annealing process of action 22 may be lower than the average annealing temperature of the annealing process of action 16.

Referring to FIG. 1, in some embodiments, the first semiconductor structure 100 may be subjected to two or more separate annealing processes prior to directly bonding metal features of the first semiconductor structure 100 to metal features of the second semiconductor structure 200 in accordance with action 20. In other words, the first semiconductor structure 100 may be subjected to one or more annealing processes in addition to that of action 16 prior to the bonding process of action 20. For example, as shown in FIG. 1, the first semiconductor structure 100 may be subjected to an additional annealing process in action 12 after depositing metal 132 on the first semiconductor structure 100 in accordance with action 10 and prior to removing a portion of the deposited metal 132 in accordance with action 14. A second example, as shown in FIG. 1, the first semiconductor structure 100 may be subjected to an additional annealing process in action 20 prior to the bonding contact between the first semiconductor structure 100 and second semiconductor structure 200.

FIG. 2B illustrates the first semiconductor structure 100 after subjecting the first semiconductor structure 100 as shown in FIG. 2A to an annealing process in accordance with action 12 (FIG. 1) after depositing metal 132 on the first semiconductor structure 100 in accordance with action 10 (FIG. 1).

As shown in FIG. 2B, subjecting the deposited metal 132 to a thermal budget to anneal the metal 132 in accordance with action 12 may induce microstructural changes therein, as previously discussed in relation to FIG. 2D, and may result in volumetric expansion (either locally, by, for example, grain reorientation and/or grain growth, or in bulk, by, for example, phase changes) of the deposited metal 132 and changes in the topography of the exposed surface 134 of the deposited metal 132.

The annealing process of action 12 may, in some embodiments, be carried out in situ in a chamber or other enclosure in which the deposition process of action 10 is also conducted. In such embodiments, the annealing process of action 12 may be carried out in the chamber or other enclosure after the deposition process of action 10, but prior to removing the first semiconductor structure 100 from the chamber or other enclosure.

In accordance with some embodiments in which the first semiconductor structure 100 is subjected to two or more separate annealing processes prior to the bonding process of action 20, the first thermal budget of action 16 may be greater than the second thermal budget of action 22, as described above. In accordance with additional such embodiments, however, the first thermal budget of action 16 may be less than the second thermal budget of action 22, but the combined thermal budgets of the annealing processes of actions 12 and 16 may be greater than the second thermal budget of action 22.

In additional embodiments, one or more active features of the second semiconductor structure 200, such as the bond pads 208, may be formed and annealed in accordance with methods as described herein in relation to the formation and annealing of the bond pads 108 with reference to FIGS. 1 and 2A through 2G.

By causing the pre-bonding annealing thermal budgets to be equal to or greater than the post-bonding annealing thermal budget, as discussed above, expansion of the metal features to be bonded in the direct bonding process due to maturation of the microstructure thereof may be at least substantially completed prior to the direct bonding process, which may improve the bonding between the semiconductor structures.

In accordance with additional embodiments of the disclosure, a cap layer comprising a material differing from that of the metal features to be bonded may be formed or otherwise provided at a surface of at least one metal feature of the first semiconductor structure 100 prior to directly bonding that metal feature to at least one metal feature of a second semiconductor structure in accordance with action 20 of FIG. 1, as described in further detail below with reference to FIGS. 3A through 3F.

Figure 3A:
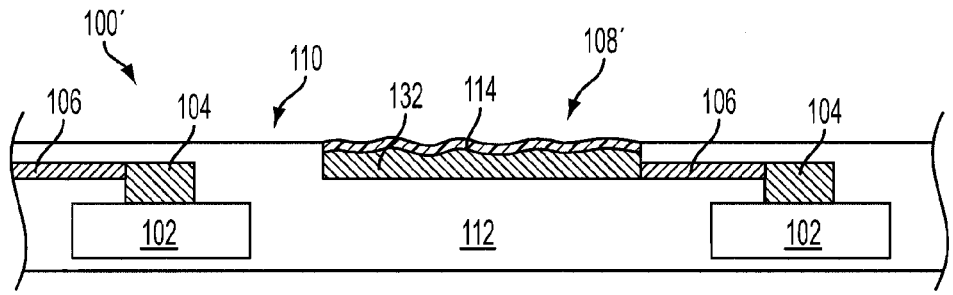
FIGS. 3A through 3F depict the formation of a bonded semiconductor structure in accordance with another embodiment of a method as illustrated in FIG. 1.

As a non-limiting example, upon formation of bond pads 108' in accordance with action 10, action 14, and action 16 (and optionally action 12) of FIG. 1, an oxide material 114 may be disposed at (e.g., on or in) an exposed major surface of bond pads 108' of a first semiconductor structure 100', as shown in FIG. 3A. By way of example and not limitation, the metal 132 of the bond pads 108' may comprise copper or a copper alloy, and the oxide material 114 may comprise copper oxide (e.g., $Cu_xO$). The oxide material 114 may result from intended or unintended oxidation of exposed surfaces of the bond pads 108', and may result from one or more previously performed processes, such as a chemical-mechanical polishing (CMP) method performed during action 14 of FIG. 1. The oxide material 114 may also simply result from exposure of the bond pads 108' to a gas comprising oxygen (e.g., air).

Figure 3B:
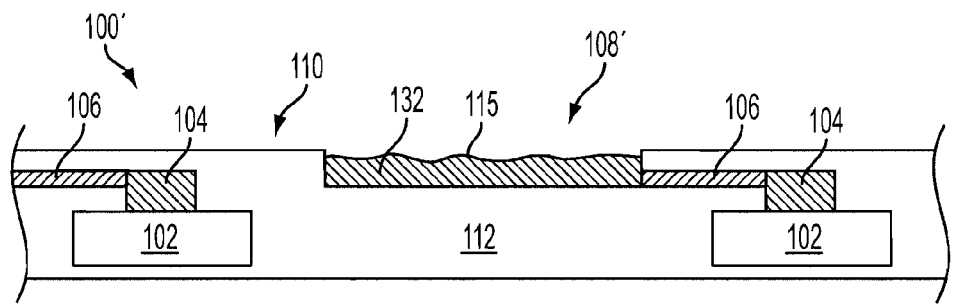
Figure 3C:
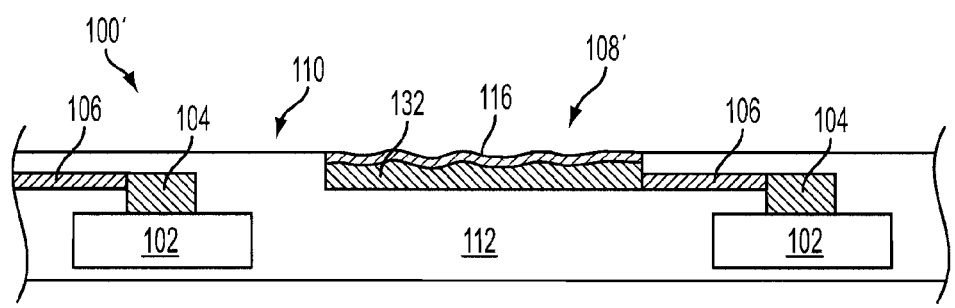

Referring to FIG. 3B, the oxide material 114 may be removed from the bond pads 108'. By way of example and not limitation, a wet chemical etching process or a dry plasma etching process may be used to remove the oxide material 114 from the bond pads 108'. After removing any oxide material 114 that may be present at the surface of the bond pads 108', a cap layer 116 comprising a material different from the metal 132 may be formed at (e.g., on or in) the exposed major surface of the bond pads 108', as shown in FIG. 3C. The cap layer 116 may comprise a material having a composition selected to hinder or prevent undesirable atomic diffusion and/or thermomechanical phenomena that might occur at the bonding interface formed during the bonding process of action 20 (FIG. 1). In some embodiments, the cap layer 116 may comprise silicon. For example, the cap layer 116 may comprise a metal silicide. As a non-limiting example, in embodiments in which the bond pads 108' comprise copper or a copper alloy, the cap layer 116 may comprise copper silicide (e.g., $CuSi_x$). Copper silicide may be formed at the surface of bond pads 108' comprising copper or a copper alloy by, for example, exposing the exposed surfaces 115 (FIG. 3B) of the bond pads 108' to a gas comprising $SiH_4$. In additional embodiments, the cap layer 116 may comprise copper silicon nitride (CuSiN), which may be formed by exposing copper silicide to a gas or plasma containing nitrogen (e.g., a gas or plasma comprising $NH_3$), this however might contribute to an increased contact resistance. In additional embodiments, the cap layer 116 may comprise a metal or metal alloy, such as a metal alloy that includes cobalt, tungsten, and phosphorous atoms (CoWP). The selectively and electrolessly deposited metal capping (CoWP) on top of Cu can further reduce interface diffusion. Another method to improve the interface diffusion may be to dope the Cu with impurities, such as Al, Ag, or Mn, typically introduced into the Cu seed layer. After annealing, the impurities segregate at grain boundaries & interfaces, including the critical bonding interface. The presence of the impurities at the interfaces reduces Cu diffusion but may increase the Cu resistivity.

In some embodiments, the cap layer 116 may be formed to have an initial average thickness of about ten nanometers (10 nm) or less (i.e., prior to bonding and/or other subsequent processing).

After forming the cap layer 116, the bond pads 108' may be directly bonded to metal features of a second semiconductor structure 200 in accordance with action 20 of FIG. 1. The bonding process may be carried out as previously described with reference to FIGS. 2E through 2G.

Figure 3D:
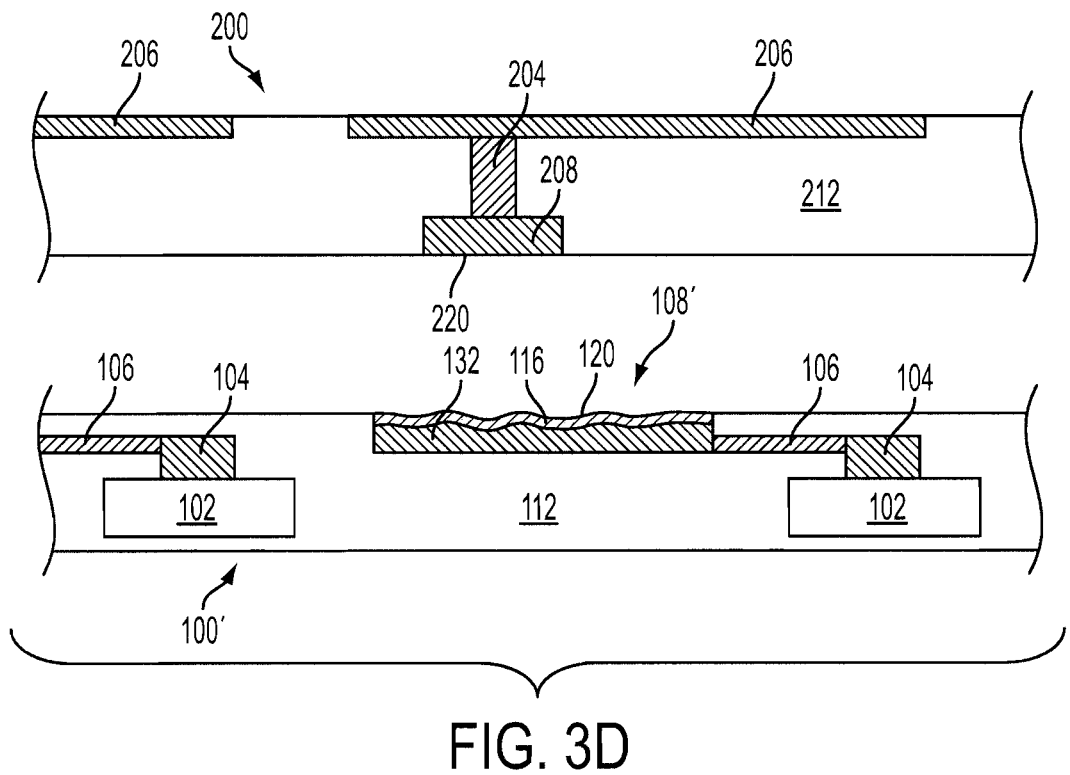

Referring to FIG. 3D, the first semiconductor structure 100' may be aligned with the second semiconductor structure 200 such that the bond pads 108' of the first semiconductor structure 100' are aligned with the conductive metallic bond pads 208 of the second semiconductor structure 200. As shown in FIG. 3D, the second semiconductor structure 200 may include additional active device structures, such as, for example, vertically extending conductive vias 204 and laterally extending conductive traces 206. Although not shown in the figures, the second semiconductor structure 200 also may comprise transistors.

Surfaces of the cap layers 116 on the bond pads 108' may define one or more bonding surfaces 120 of the bond pads 108', and exterior exposed surfaces of the bond pads 208 may define bonding surfaces 220 of the bond pads 208 of the second semiconductor structure 200.

Figure 3E:
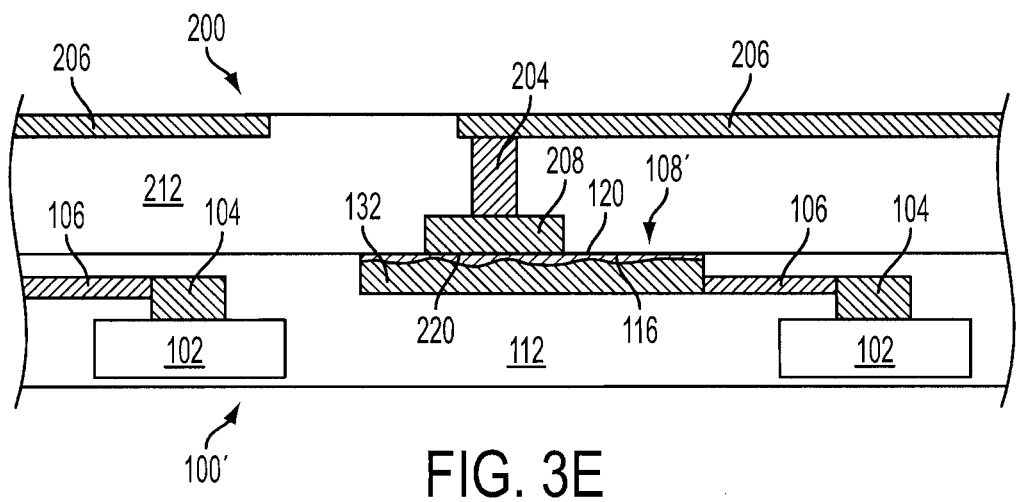

Referring to FIG. 3E, after aligning the first semiconductor structure 100' with a second semiconductor structure 200 such that the bond pads 108' of the first semiconductor structure 100' are aligned with the conductive metallic bond pads 208 of the second semiconductor structure 200, the first semiconductor structure 100' may be abutted against the second semiconductor structure 200 such that the bonding surfaces 120 of the bond pads 108' of the first semiconductor structure 100' are abutted directly against the bonding surfaces 220 of the bond pads 208 of the second semiconductor structure 200.

Figure 3F:
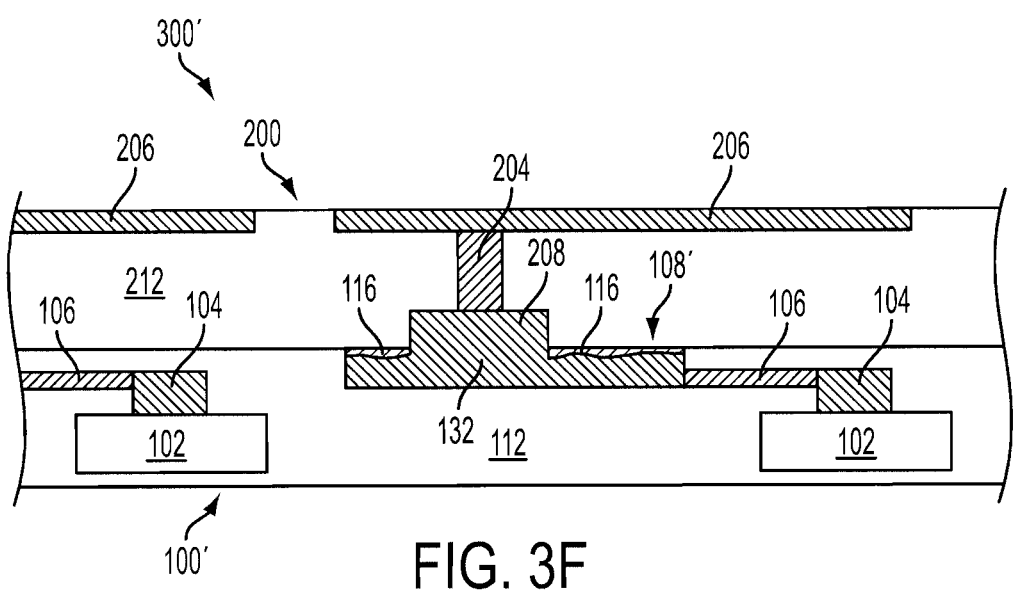

Referring to FIG. 3F, the bonding surfaces 120 (FIG. 3E) of the bond pads 108' of the first semiconductor structure 100' then may be directly bonded to the bonding surfaces 220 (FIG. 3E) of the bond pads 208 of the second semiconductor structure 200 to form a bonded semiconductor structure 300'. For example, the bonding surfaces 220 of the bond pads 208 of the second semiconductor structure 200 may be directly bonded to the bonding surfaces 120 of the bond pads 108' of the first semiconductor structure 100' in a direct metal-to-metal (e.g., copper-to-copper) non thermo-compression bonding process. In some embodiments, the non thermo-compression bonding process may comprise an ultra-low temperature direct bonding process carried out in an environment at a temperature or temperatures of about four hundred degrees Celsius (400° C.) or less, or even in an environment at a temperature or temperatures of about two hundred degrees Celsius (200° C.) or less. In some embodiments, the non thermo-compression bonding process may be carried out at a temperature or temperatures of between about twenty degrees Celsius (20° C.) and about four hundred degrees Celsius (400° C.), or even at a temperature or temperatures of between about two hundred degrees Celsius (200° C.) and about three hundred and fifty degrees Celsius (350° C.). In other embodiments, the non thermo-compression bonding process may be carried out in an environment at about room temperature (i.e., without any applied heat additional to that provided by the ambient environment).

As shown in FIG. 3F, in some embodiments, upon directly bonding the bond pads 108' of the first semiconductor structure 100' to the bond pads 208 of the second semiconductor structure 200, one or more elements of the cap layer 116 at the interface between the bond pads 108' and the bond pads 208 may diffuse into the bond pads 108' and/or the bond pads 208, such that the cap layer 116 is no longer present as a distinct phase at the bonded interface between the bond pads 108' and the bond pads 208. At least a portion of the cap layer 116 may remain over at least a portion of the bond pads 108', as shown in FIG. 3F. The presence of at least a portion of the cap layer 116 over the bond pads 108' subsequent to the bonding process may be beneficial for reasons discussed in further detail below.

In embodiments wherein the bond pads 108' and the bond pads 208 differ in at least one of size and shape and/or are misaligned with one another, at least a portion of the cap layer 116 on one or more of the bond pads 108' may not abut against, and may not be directly bonded to, any portion of a bond pad 208. Such portions of the cap layer 116 may abut against a bulk material 212 surrounding the bond pads 208, for example. These portions of the cap layer 116 may or may not be bonded to the abutting bulk material 212, and may not entirely dissolve into the bond pads 108' upon bonding the bond pads 108' to the bond pads 208. In such embodiments, the presence of at least a portion of the cap layer 116 at the interface between the bond pads 108' and the bulk material 212 after the bonding process may improve the useable lifetime and/or improve the performance of, the conductive structures formed by the adjoined bond pads 108' and the bond pads 208. For example, the presence of the cap layer 116 at the interface between the bond pads 108' and the bulk material 212 may hinder or prevent mass transport at the interface between the bond pads 108' and the bulk material 212, which may occur due to, for example, electromigration. The presence of the cap layer 116 also may suppress the occurrence of undesirable thermomechanical phenomena, such as, for example, undesirable changes in microstructure that might result from temperature fluctuations to which the structures may be subjected during subsequent processing and/or operation.

In additional embodiments, exposed surfaces of one or more active features of the second semiconductor structure 200, such as the exposed surfaces of the bond pads 208, may be processed as discussed above in relation to the bond pads 108' of the first semiconductor structure 100', such that the bonding surfaces 220 of the bond pads 208 comprise a cap layer (like the cap layer 116).

After bonding the first semiconductor structure 100' to the second semiconductor structure 200 to form the bonded semiconductor structure 300' of FIG. 3F, the bonded metal structures comprising the bond pads 108' and bond pads 208 may be annealed in accordance with action 22 of FIG. 1 by exposing the bonded metal structures to a second thermal budget, as previously described with reference to the embodiment of FIGS. 2A through 2G.

Figure 4:
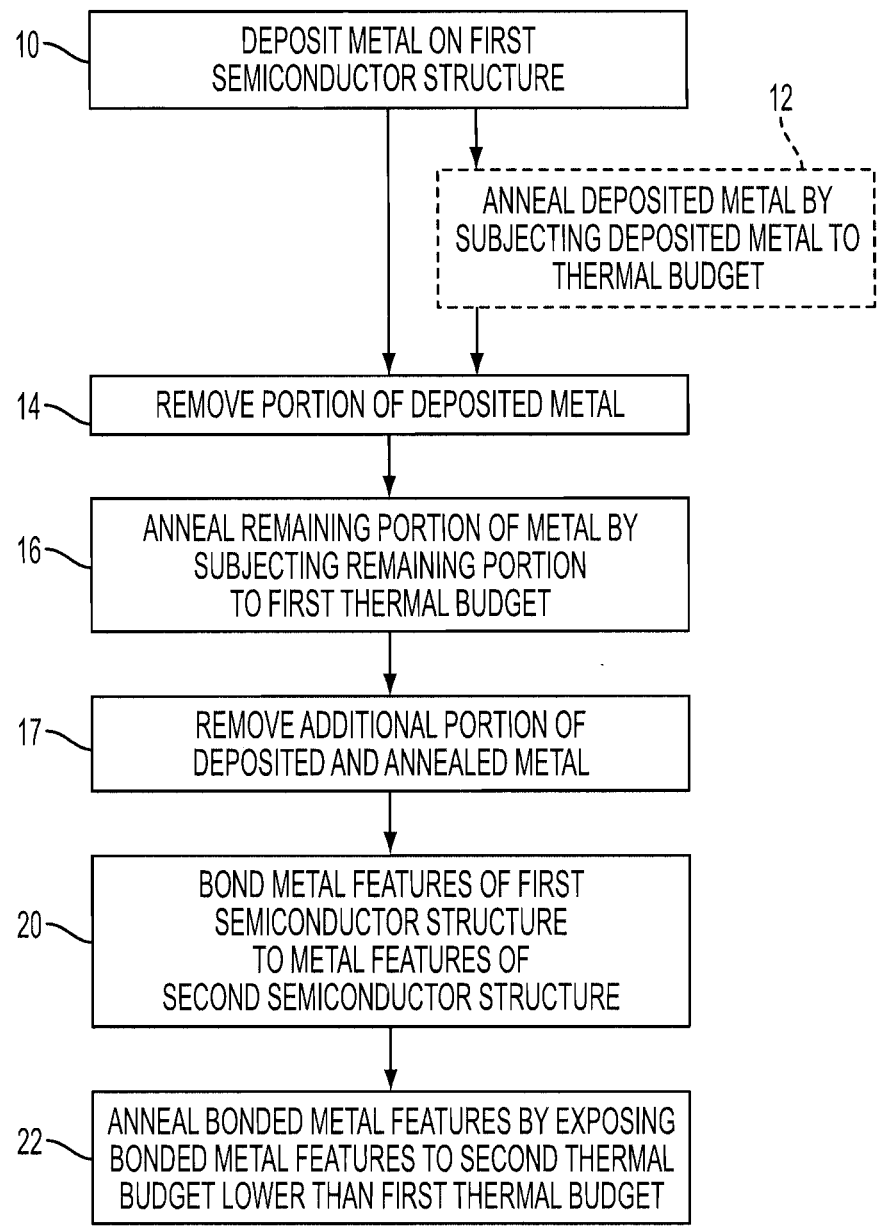
FIG. 4 is a flow chart illustrating a process flow of additional example embodiments of methods of forming bonded semiconductor structures of the disclosure.
Figure 5:
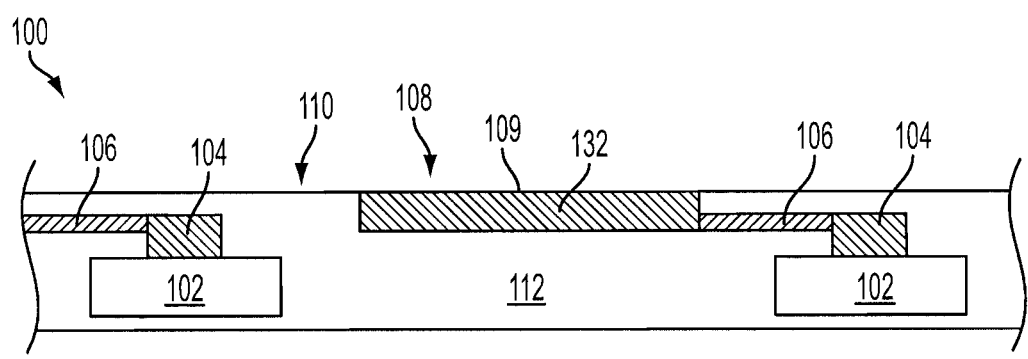
FIG. 5 depicts a semiconductor structure that may be fabricated in the formation of bonded semiconductor structures of the disclosure in accordance with embodiments of methods as illustrated in FIG. 4.

FIG. 4 illustrates a process flow of additional embodiments of methods of the disclosure, and FIG. 5 is used in conjunction with FIGS. 2A through 2G to illustrate the fabrication of a bonded semiconductor structure in accordance with the process flow of FIG. 4. As shown in FIG. 4, the process flow illustrated therein includes the deposition of metal 132 on a first semiconductor structure 100 in accordance with action 14, the removal of a portion of the deposited metal 132 from the first semiconductor structure 100 in accordance with action 16, and the annealing of the remaining portion of the metal 132 by subjecting the remaining portion of the metal 132 to a first thermal budget in accordance with actions 16. The process flow of FIG. 4 may also include the optional additional annealing of the deposited metal 132 in accordance with action 12. These actions 10, 12, 14, and 16 may proceed as previously described with reference to FIGS. 2A through 2D to form the first semiconductor structure 100 shown in FIG. 2D.

As shown in FIG. 2D, the annealing process of action 16 may result in volumetric expansion (either locally, by, for example, grain reorientation and/or grain growth, or in bulk, by, for example, phase changes) of the deposited metal 132 and changes in the topography of the exposed surfaces of the bond pads 108, which define bonding surfaces 109 of the bond pads 108. As a result, the bonding surfaces 109 of the bond pads 108 may extend vertically (from the perspective of FIG. 2D) beyond the exposed surface of the surrounding bulk material 112 at the active surface 110, and/or the surface roughness of the bonding surfaces 109 may be increased.

Referring again to FIG. 4, in accordance with some embodiments of the disclosure, an additional portion of the deposited and annealed metal 132 of the bond pads 108 may be removed in an additional removal process in accordance with action 17 after the annealing process of action 16. The removal process of action 17 may comprise, for example, a planarization process that improves the planarity (and decreases the overall average surface roughness of) the active surface 110 of the semiconductor structure 100, and/or that decreases a surface roughness of the bonding surfaces 109 of the bond pads 108. Thus, FIG. 5 illustrates the bonding surfaces 109 of the bond pads 108 as having decreased surface roughness relative to FIG. 2D, and illustrates the bonding surfaces 109 as being coplanar with the exposed surface of the surrounding bulk material 112 at the active surface 110.

In action 17, the additional portion of the deposited and annealed metal 132 may be removed using, for example, an etching process (e.g., a wet chemical etching process, a dry reactive ion etching process, etc.), a polishing or grinding process, or combination thereof, such as a chemical-mechanical polishing (CMP) process. For example, the active surface 110 of the first semiconductor structure 100 may be subjected to a CMP process to remove additional deposited and annealed metal 132 of the bond pads 108.

Referring again to FIG. 4, after removing an additional portion of the deposited and annealed metal 132 of the bond pads 108 in accordance with action 17 to form the first semiconductor structure 100 as shown in FIG. 5, the bond pads 108 of the first semiconductor structure 100 may be directly bonded to the bond pads 208 of the second semiconductor structure 200 in accordance with action 20, as previously described with reference to FIG. 1 and FIGS. 2E through 2G. After the direct bonding process of action 20, the bonded metal features comprising the bond pads 108 of the first semiconductor structure 100 and the bond pads 208 of the second semiconductor structure 200 may be annealed by subjecting the bonded metal features to a second thermal budget that is lower than the first thermal budget, as previously with reference to FIG. 1 and FIG. 2G. Although not shown in FIG. 4, the bonding surfaces 109 of the bond pads 108 may be prepared for bonding in accordance with action 18 (FIG. 1) by subjecting the active surface 110 of the first semiconductor structure 100 to a cleaning process, as previously described with reference to FIG. 1.

In additional embodiments, a cap layer 116 may be formed or otherwise provided at a surface of at least one metal feature of the first semiconductor structure 100 prior to directly bonding that metal feature to at least one metal feature of a second semiconductor structure in accordance with action 20 of FIG. 4, as previously described with reference to FIGS. 3A through 3F.

Figure 6:
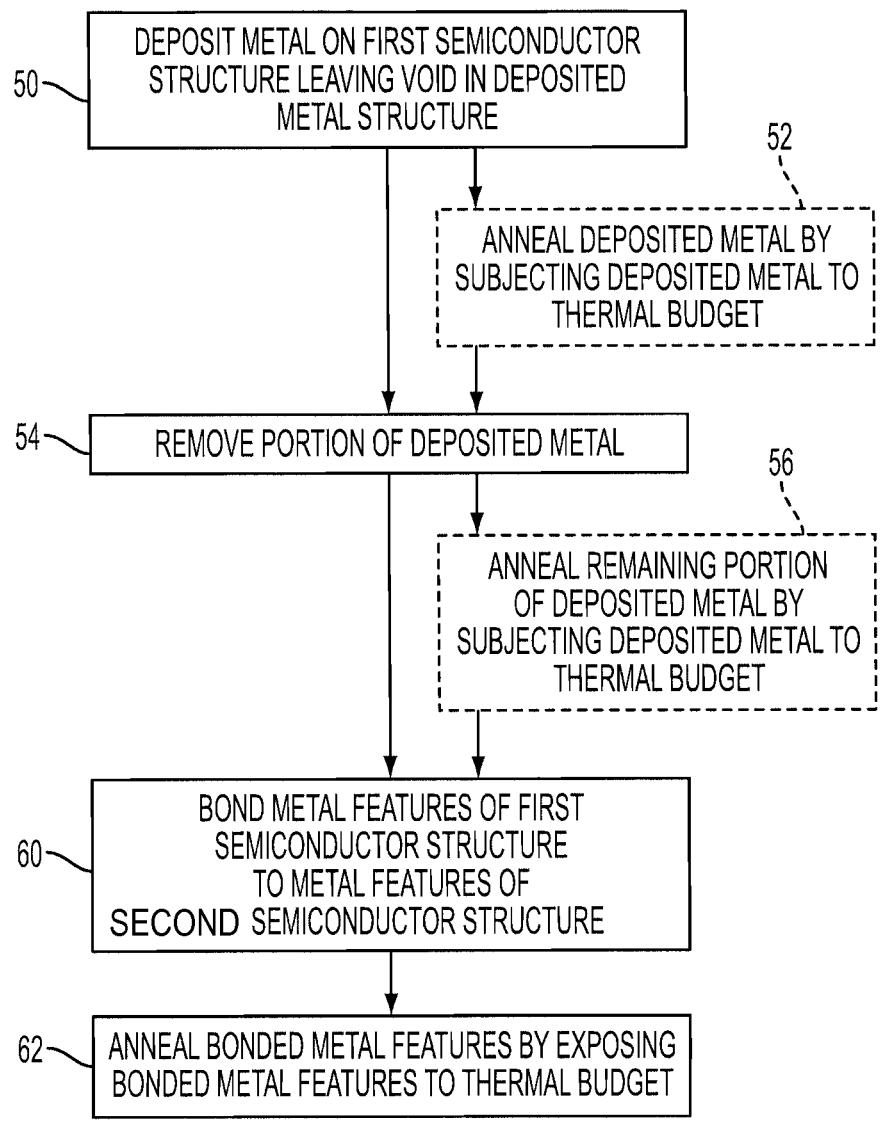
FIG. 6 is a flow chart illustrating a process flow of additional example embodiments of methods of forming bonded semiconductor structures of the disclosure.

FIG. 6 illustrates a process flow of additional embodiments of methods of the disclosure, and FIGS. 7A through 7E illustrate the fabrication of a bonded semiconductor structure in accordance with the process flow of FIG. 6.

Figure 7A:
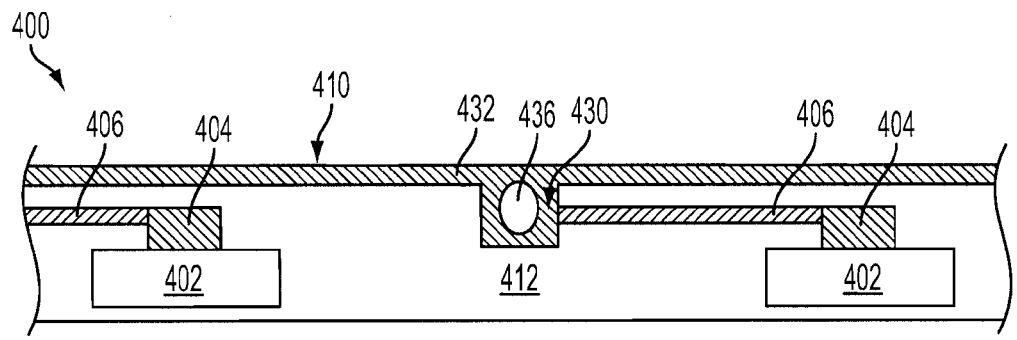
FIGS. 7A through 7E depict the formation of a bonded semiconductor structure in accordance with an embodiment of a method as illustrated in FIG. 6.

Referring to FIG. 6, in action 50, metal 432 may be deposited over a first semiconductor structure. As shown in FIG. 7A, a first semiconductor structure 400 may be formed. The first semiconductor structure 400 may be substantially similar to the first semiconductor structure 100 previously described in relation to FIG. 2A, and may comprise a processed semiconductor structure that includes one or more active device features, such as one or more of a plurality of transistors 402 (which are schematically represented in the figures), a plurality of vertically extending conductive vias 404, and a plurality of horizontally extending conductive traces 406. The active device features may comprise electrically conductive materials and/or semiconductor materials that are surrounded by non-conductive bulk material 412. By way of example and not limitation, one or more of the conductive vias 404 and the conductive traces 406 may comprise one or more conductive metals or metal alloys such as, for example, copper, aluminum, or an alloy or mixture thereof.

Figure 7B:
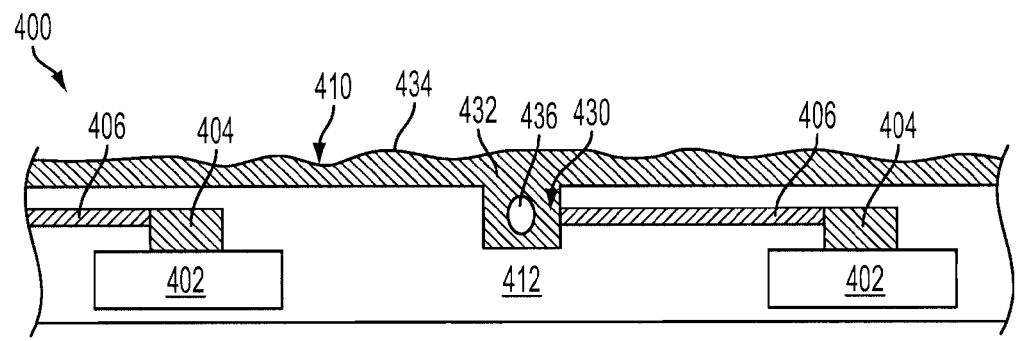
Figure 7C:
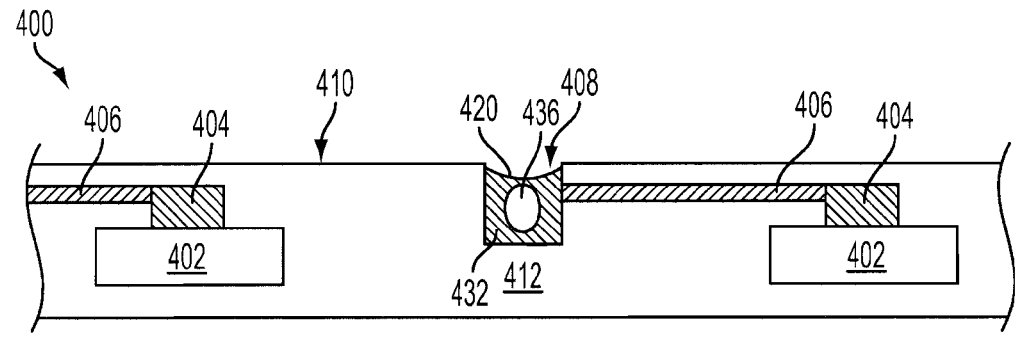

The first semiconductor structure 400 may also comprise a plurality of recesses 430 in which it is desired to form a plurality of bond pads 408 (FIG. 7C). To form the bond pads 408, metal 432 may be deposited over (e.g., onto) the active surface 410 of the first semiconductor structure 400, such that the metal 432 at least entirely fills the recesses 430 as shown in FIG. 7A. Excess metal 432 may be deposited onto the first semiconductor structure 400 such that the recesses 430 are entirely filled with the metal 432, and such that additional metal 432 is disposed over (e.g., covers) the active surface 410 of the first semiconductor structure 400. By way of example and not limitation, the metal 432 may comprise a metal or metal alloy such as copper, aluminum, or an alloy or mixture thereof. In some embodiments, the metal 432 may be selected to comprise copper or a copper alloy.

As shown in FIG. 7A, the metal 432 may be deposited on the first semiconductor structure 400 such that a void 436 is formed in the portions of the deposited metal 432 within the recesses 430. In other words, the metal 432 may be formed to include at least one inner surface that defines a void 436 in the portions of the deposited metal 432 within the recesses 430. The voids may be created, for example, during the electrodeposition process by increasing the metal growth speed on the vertical sides of the lines and vias. Under these conditions, voids are spontaneously created in the vias or lines. An addition method to create such voids may be achieved by non-conformal deposition of the diffusion barrier (or metal seed layer). By increasing the side thickness of the barrier/seed layer in the vias/lines, voids can be created directly while the barrier deposition process or at the early stage of the metal deposition stage. The metal 432 may be deposited onto the first semiconductor structure 400 using, for example, one or more of an electroless plating process, an electrolytic plating process, a chemical vapor deposition (CVD) process, and a physical vapor deposition (PVD) process. As a non-limiting example, a seed layer of copper may be deposited using an electroless plating processes, after which additional copper may be deposited onto the seed layer of copper at a relatively faster rate using an electrolytic plating process. The metal 432 may be deposited onto the first semiconductor structure 400 using, for example, one or more of an electroless plating process, an electrolytic plating process, a chemical vapor deposition (CVD) process, and a physical vapor deposition (PVD) process. As a non-limiting example, a seed layer of copper may be deposited using an electroless plating processes, after which additional copper may be deposited onto the seed layer of copper at a relatively faster rate using an electrolytic plating process.

Referring again to FIG. 6, in action 54, a portion of the deposited metal 432 (FIG. 7A) may be removed from the first semiconductor structure 400 to form bond pads 408 that comprise remaining portions of the deposited metal 432 disposed in the recesses 430, as shown in FIG. 7C. The portion of the deposited metal 432 may be removed in accordance with action 14 (FIG. 6) using, for example, an etching process (e.g., a wet chemical etching process, a dry reactive ion etching process, etc.), a polishing or grinding process, or combination thereof, such as a chemical-mechanical polishing (CMP) process. For example, the active surface 410 of the first semiconductor structure 400 may be subjected to a CMP process to remove portions of the deposited metal 432 (FIG. 7A) overlying areas of the bulk material 412 outside the recesses 430, such that only regions of the deposited metal 432 within the recesses 430 remain (which regions define and comprise the bond pads 408), and such that the bulk material 412 is exposed at the active surface 410 in the areas laterally adjacent the regions of the deposited metal 432 within the recesses 430. Thus, one or more of the bond pads 408 may be exposed at the active surface 410 of the first semiconductor structure 400.

As shown in FIG. 7C, the process used to remove excess metal 432 from the first semiconductor structure 400 (e.g., a CMP process) may result in dishing of the exposed surfaces of the bond pads 408 in some embodiments. Further, in some embodiments, the exposed surfaces of the bond pads 408 may be slightly recessed relative to the exposed major surface of the surrounding bulk material 412 at the active surface 410 after removing a portion of the deposited metal 432 in accordance with action 54.

Referring again to FIG. 6, in action 60, the bond pads 408 may be directly bonded to metal features of a second semiconductor structure. An example of a direct bonding process that may be used to directly bond the bond pads 408 to metal features of a second semiconductor structure is described below with reference to FIGS. 7D and 7E.

Figure 7D:
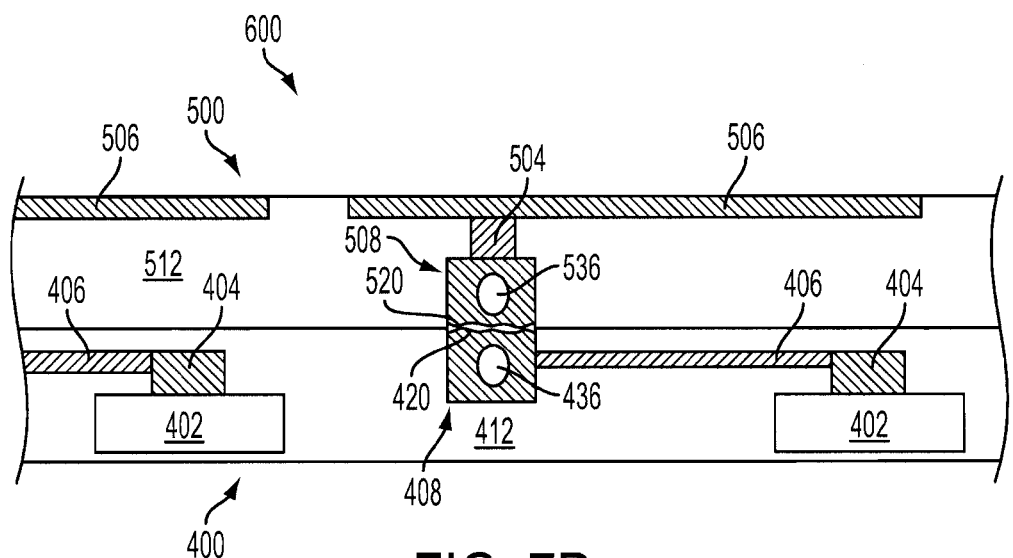
Figure 7E:
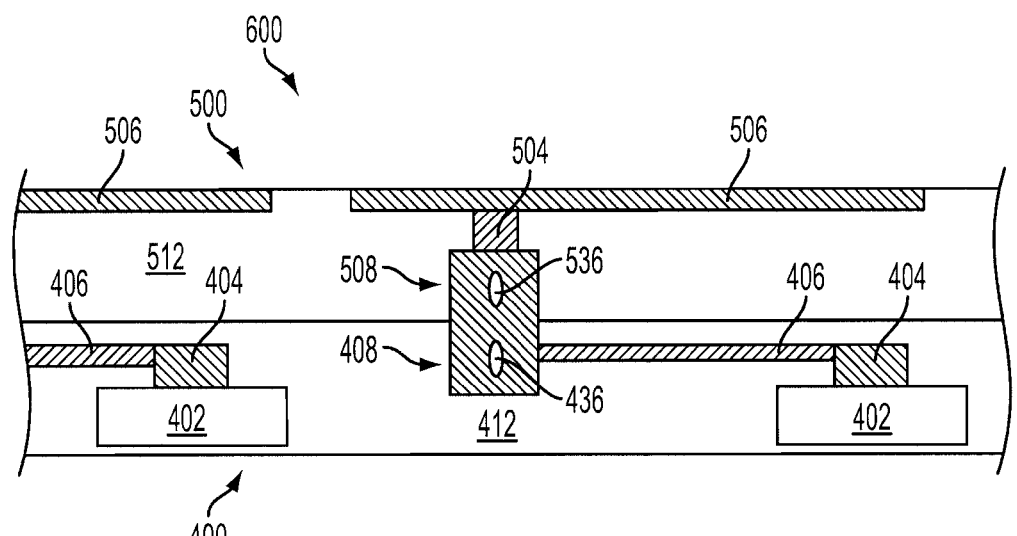

Referring to FIG. 7D, the first semiconductor structure 400 may be aligned with a second semiconductor structure 500 such that the bond pads 408 of the first semiconductor structure 400 are aligned with conductive metallic bond pads 508 of the second semiconductor structure 500. As shown in FIG. 7D, the second semiconductor structure 500 may be substantially similar to the second semiconductor structure 200 previously described with reference to FIGS. 2E through 2G, and may also comprise a processed semiconductor structure that includes additional active device structures, such as vertically extending conductive vias 504 and laterally extending conductive traces 506. Although not shown in the figures, the second semiconductor structure 500 also may comprise transistors. As shown in FIG. 7D, in some embodiments, the bond pads 508 of the second semiconductor structure 500 may be at least substantially identical to the bond pads 408 of the first semiconductor structure 400, and may include voids 536 in the conductive metal of the bond pads 508, like the voids 436 in the metal 432 of the bond pads 408 of the first semiconductor structure 400. In other embodiments, the bond pads 508 may not include such voids 536 therein.

Exposed surfaces of the bond pads 408 may define one or more bonding surfaces 420 of the bond pads 408, and exterior exposed surfaces of the bond pads 508 may define bonding surfaces 520 of the bond pads 508 of the second semiconductor structure 500.

With continued reference to FIG. 7D, after aligning the first semiconductor structure 400 with the second semiconductor structure 500 such that the bond pads 408 of the first semiconductor structure 400 are aligned with the conductive metallic bond pads 508 of the second semiconductor structure 500, the first semiconductor structure 400 may be abutted against the second semiconductor structure 500 such that the bonding surfaces 420 of the bond pads 408 of the first semiconductor structure 400 are abutted directly against the bonding surfaces 520 of the bond pads 508 of the second semiconductor structure 500 without any intermediate bonding material (e.g., adhesive) therebetween.

The bonding surfaces 420 of the bond pads 408 of the first semiconductor structure 400 then may be directly bonded to the bonding surfaces 520 of the bond pads 508 of the second semiconductor structure 500 to form a bonded semiconductor structure 600. The bonding process results in the formation of bonded metal structures that include the bond pads 408 and the bond pads 508 that have been bonded together. The bonding surfaces 520 of the bond pads 508 of the second semiconductor structure 500 may be directly bonded to the bonding surfaces 420 of the bond pads 408 of the first semiconductor structure 400 in a direct metal-to-metal (e.g., copper-to-copper) non thermo-compression bonding process. In some embodiments, the non thermo-compression bonding process may comprise an ultra-low temperature direct bonding process carried out in an environment at a temperature or temperatures of about four hundred degrees Celsius (400° C.) or less, or even in an environment at a temperature or temperatures of about two hundred degrees Celsius (200° C.) or less. In some embodiments, the non thermo-compression bonding process may be carried out at a temperature or temperatures of between about twenty degrees Celsius (20° C.) and about four hundred degrees Celsius (400° C.), or even at a temperature or temperatures of between about two hundred degrees Celsius (200° C.) and about three hundred and fifty degrees Celsius (350° C.). In other embodiments, the non thermo-compression bonding process may be carried out in an environment at about room temperature (i.e., without any applied heat additional to that provided by the ambient environment).

Prior to bonding the first semiconductor structure 400 to the second semiconductor structure 500, the first semiconductor structure 400 and the second semiconductor structure 500 may be processed to remove surface impurities and undesirable surface compounds, and may be planarized to increase the area of intimate contact at the atomic scale between the bonding surfaces 420 of the bond pads 408 and the bonding surfaces 520 of the bond pads 508. The area of intimate contact between the bonding surfaces 420 and the bonding surfaces 520 may be accomplished by polishing the bonding surfaces 420 and the bonding surfaces 520 to reduce the surface roughness thereof up to values close to the atomic scale, by applying pressure between the bonding surfaces 420 and the bonding surfaces 520 resulting in plastic deformation, or by both polishing the bonding surfaces 420, 520 and applying pressure between the first semiconductor structure 400 and the second semiconductor structure 500 to attain such plastic deformation.

In some embodiments, the first semiconductor structure 400 may be directly bonded to the second semiconductor structure 500 without applying pressure between the bonding surfaces 420, 520 at the bonding interface therebetween, although pressure may be applied between the bonding surfaces 420, 520 at the bonding interface in some ultra-low temperature direct bonding methods in order to achieve a suitable bond strength at the bonding interface. In other words, the direct bonding methods used to bond the bond pads 408 of the first semiconductor structure 400 to the bond pads 508 of the second semiconductor structure 500 may comprise surface assisted bonding (SAB) bonding methods in some embodiments of the disclosure.

As shown in FIG. 7D, upon bonding the bond pads 408 of the first semiconductor structure 400 to the bond pads 508 of the second semiconductor structure 500, the bonding interface may remain relatively identifiable in the microstructure thereof when viewed under magnification. Additionally, voids 436 may remain within the bond pads 408, and voids 536 also may remain within the bond pads 508.

Referring again to FIG. 6, in action 62, the bonded metal features comprising the bond pads 408 and the bond pads 508 may be annealed by exposing the bonded semiconductor structure 600 (and, hence, the bonded metal structures) to a thermal budget. By way of example and not limitation, the bonded metal structures may be annealed by subjecting the bond pads 408 and the bond pads 508 to an annealing temperature or temperatures below about 400° C. for an annealing time period of about two hours or less (e.g., between about thirty minutes (30 minutes) and about one hour (1 hour)).

The annealing process of action 62 may, in some embodiments, be carried out in situ in a chamber or other enclosure in which the bonding process of action 60 is also conducted. In such embodiments, the annealing process of action 62 may comprise a later segment or portion of a continuous thermal cycle to which the semiconductor structure 400 is subjected in the chamber or other enclosure.

The annealing process of action 62 may induce microstructural changes in the bond pads 408 and the bond pads 508, and may result in volumetric expansion (either locally, by, for example, grain reorientation and/or grain growth, or in bulk, by, for example, phase changes) of the metal of the bond pads 408 and 508. The presence of the voids 436 in the bond pads 408 and the voids 536 in the bond pads 508 may provide space into which the metal 432 may expand due to such volumetric expansion. Thus, after the annealing process of action 62, the voids 436 and 536 within the bond pads 408 and 508, respectively, may occupy a smaller volume (i.e., have a smaller average cross-sectional size). In some embodiments, the voids 436, 536 may no longer be present within the bond pads 408, 508 after the annealing process of action 62. Additionally, there may not be any discrete identifiable bonding interface in the microstructure between the bond pads 408 and the bond pads 508 when viewed under magnification after the annealing process of action 62 in some embodiments.

As shown in FIG. 6, in some embodiments, at least a portion of the metal 432 (FIG. 7A) may be subjected to one or more annealing processes prior to the bonding process of action 60.

For example, in some embodiments, after depositing the metal 432 over the first semiconductor structure 400 in accordance with action 50 as previously described with reference to FIG. 7A, and prior to removing a portion of the metal 432 in accordance with action 54 as previously described with reference to FIG. 7C, the deposited metal 432 may be subjected to a thermal budget to anneal the metal 432. FIG. 7B illustrates the first semiconductor structure 400 after subjecting the semiconductor structure 400 as shown in FIG. 7A to an annealing process in accordance with action 52 (FIG. 6) after depositing metal 432 on the first semiconductor structure 400 in accordance with action 50 (FIG. 6).

As shown in FIG. 7B, subjecting the deposited metal 432 to a thermal budget to anneal the metal 432 in accordance with action 52 may induce microstructural changes therein, as previously discussed in relation to FIG. 2D, and may result in volumetric expansion (either locally, by, for example, grain reorientation and/or grain growth, or in bulk, by, for example, phase changes) of the deposited metal 432 and changes in the topography of the exposed surface 434 of the deposited metal 432.

The annealing process of action 52 may, in some embodiments, be carried out in situ in a chamber or other enclosure in which the deposition process of action 50 is also conducted. In such embodiments, the annealing process of action 52 may be carried out in the chamber or other enclosure after the deposition process, but prior to removing the first semiconductor structure 400 from the chamber or other enclosure.

In embodiments in which the deposited metal 432 is annealed in accordance with action 52, the thermal budget of the annealing process of action 52 may be greater than the thermal budget of the annealing process of action 62. In some embodiments, the annealing temperature or temperatures of the annealing process of action 62 may be at least substantially the same as the annealing temperature or temperatures of the annealing process of action 52. In such embodiments, the annealing time period of the annealing process of action 62 may be shorter than the annealing time period of the annealing process of action 52. In additional embodiments, the annealing time period of the annealing process of action 62 may be at least substantially the same as the annealing time period of the annealing process of action 52. In such embodiments, the average annealing temperature of the annealing process of action 62 may be lower than the average annealing temperature of the annealing process of action 52. In yet further embodiments, the annealing time period of the annealing process of action 62 may be shorter than the annealing time period of the annealing process of action 52, and the average annealing temperature of the annealing process of action 62 may be lower than the average annealing temperature of the annealing process of action 52.

Referring again to FIG. 6, in some embodiments, after removing a portion of the deposited metal 432 in accordance with action 54 as previously described with reference to FIG. 7C, and prior to the bonding process of action 60, the remaining portion of the deposited metal 432 may be subjected to a thermal budget to anneal the remaining portion of the metal 432. Such an annealing process may be at least substantially identical to the annealing process of action 16 of FIG. 1, as previously described with reference to FIG. 2D. In such embodiments, the thermal budget of the annealing process of action 54 may be greater than the thermal budget of the annealing process of action 62. In some embodiments, the annealing temperature or temperatures of the annealing process of action 62 may be at least substantially the same as the annealing temperature or temperatures of the annealing process of action 54. In such embodiments, the annealing time period of the annealing process of action 62 may be shorter than the annealing time period of the annealing process of action 54. In additional embodiments, the annealing time period of the annealing process of action 62 may be at least substantially the same as the annealing time period of the annealing process of action 54. In such embodiments, the average annealing temperature of the annealing process of action 62 may be lower than the average annealing temperature of the annealing process of action 54. In yet further embodiments, the annealing time period of the annealing process of action 62 may be shorter than the annealing time period of the annealing process of action 54, and the average annealing temperature of the annealing process of action 62 may be lower than the average annealing temperature of the annealing process of action 54.

In some embodiments, the process flow of FIG. 6 may include both the annealing process of action 52 and the annealing process of action 56. In accordance with some such embodiments, the thermal budget of action 52 may be greater than the thermal budget of action 62, and the thermal budget of action 56 may be less than, equal to, or greater than the thermal budget of the annealing process of action 52. In accordance with additional such embodiments, the thermal budget of action 56 may be greater than the thermal budget of action 62, and the thermal budget of action 52 may be less than, equal to, or greater than the thermal budget of the annealing process of action 56. In yet further such embodiments, the thermal budget of action 52 may be less than the thermal budget of action 62, and the thermal budget of action 56 may be less than the thermal budget of action 62, but the combined thermal budgets of the annealing processes of action 52 and action 56 may be greater than the thermal budget of action 62.

In additional embodiments, one or more active features of the second semiconductor structure 500, such as the bond pads 508, may be formed and annealed in accordance with methods as described herein in relation to the formation and annealing of the bond pads 408 with reference to FIGS. 6 and 7A through 7E.

Further, in additional embodiments, a cap layer 116 may be formed or otherwise provided at a surface of at least one metal feature of the first semiconductor structure 400 prior to directly bonding that metal feature to at least one metal feature of a second semiconductor structure in accordance with action 60 of FIG. 6, as previously described with reference to FIGS. 3A through 3F.

Although embodiments of the disclosure are described above with reference to the direct bonding of bond pads of a first semiconductor structure to bond pads of a second semiconductor structure, it is contemplated that metallic features other than bond pads of the first and second semiconductor structures may be processed and directly bonded as described herein. For example, such other metallic features may comprise conductive vias, through-wafer interconnects, conductive traces, or any other metallic feature exposed at a surface semiconductor structure. Additionally, it is contemplated that the conductive features of the second semiconductor structure, such as one or more of bond pads, conductive vias, and conductive traces, may be formed and processed (e.g., annealed) as described herein in relation to the bond pads of the first semiconductor structures, in addition to, or as an alternative to, processing of the conductive features of the first semiconductor structure, prior to directly bonding together the one or more conductive features of the first semiconductor structure and the one or more conductive features of the second semiconductor structure.

Additional non-limiting example embodiments of the disclosure are described below:

Embodiment 1

A method of directly bonding a first semiconductor structure to a second semiconductor structure, comprising: depositing metal over a first semiconductor structure; removing a portion of the metal deposited over the first semiconductor structure; subjecting a remaining portion of the metal deposited over the first semiconductor structure to a first thermal budget and annealing the remaining portion of the metal deposited over the first semiconductor structure; directly bonding at least one metal feature of the first semiconductor structure comprising the remaining portion of the metal deposited over the first semiconductor structure to at least one metal feature of a second semiconductor structure to form a bonded metal structure comprising the at least one metal feature of the first semiconductor structure and the at least one metal feature of the second semiconductor structure; and subjecting the bonded metal structure to a second thermal budget and annealing the bonded metal structure, the second thermal budget being less or equal than the first thermal budget.

Embodiment 2

The method of Embodiment 1, wherein subjecting the remaining portion of the metal deposited over the first semiconductor structure to the first thermal budget and annealing the remaining portion of the metal deposited over the first semiconductor structure comprises subjecting the remaining portion of the metal to a first average annealing temperature over a first annealing time period, and wherein subjecting the bonded metal structure to a second thermal budget and annealing the bonded metal structure comprises subjecting the bonded metal structure to a second average annealing temperature over a second annealing time period.

Embodiment 3

The method of Embodiment 2, wherein the first average annealing temperature is higher or equal than the second average annealing temperature.

Embodiment 4

The method of Embodiment 2, wherein the first annealing time period is longer or equal than the second annealing time period.

Embodiment 5

The method of Embodiment 2, wherein the first average annealing temperature is higher or equal than the second average annealing temperature, and wherein the first annealing time period is longer or equal than the second annealing time period.

Embodiment 6

The method of any one of Embodiments 1 through 5, further comprising annealing the metal deposited over the first semiconductor structure prior to removing the portion of the metal deposited over the first semiconductor structure.

Embodiment 7

The method of any one of Embodiments 1 through 6, wherein removing the portion of the metal deposited over the first semiconductor structure comprises subjecting the first semiconductor structure to a chemical-mechanical polishing process.

Embodiment 8

The method of any one of Embodiments 1 through 7, further comprising selecting the metal deposited over the first semiconductor structure to comprise copper or a copper alloy.

Embodiment 9

The method of any one of Embodiments 1 through 8, further comprising forming a cap layer at a surface of the at least one metal feature of the first semiconductor structure prior to directly bonding the at least one metal feature of the first semiconductor structure to the at least one metal feature of the second semiconductor structure.

Embodiment 10

The method of Embodiment 9, wherein forming the cap layer comprises forming the cap layer to comprise a metal silicide.

Embodiment 11

The method of Embodiment 9, wherein forming the cap layer comprises forming the cap layer to comprise a metal, silicon, and nitrogen.

Embodiment 12

The method of Embodiment 9, wherein forming the cap layer comprises forming the cap layer to comprise a metal alloy.

Embodiment 13

The method of Embodiment 12, further comprising forming the cap layer to comprise CoWP.

Embodiment 14

The method of any one of Embodiments 9 through 13, further comprising forming the cap layer to have an average thickness of about ten nanometers (10 nm) or less.

Embodiment 15

The method of any one of Embodiments 1 through 14, wherein directly bonding the at least one metal feature of the first semiconductor structure to the at least one metal feature of the second semiconductor structure comprises bonding at temperatures between 20° C. and 400° C. without applying pressure.

Embodiment 16

The method of any one of Embodiments 1 through 15, wherein directly bonding the at least one metal feature of the first semiconductor structure to the at least one metal feature of the second semiconductor structure comprises a surface assisted bonding process.

Embodiment 17

The method of any one of Embodiments 1 through 16, wherein directly bonding the at least one metal feature of the first semiconductor structure to the at least one metal feature of the second semiconductor structure comprises abutting a first bonding surface of the at least one metal feature of the first semiconductor structure directly against a second bonding surface of the at least one metal feature of the second semiconductor structure in an environment at a temperature less than about four hundred degrees Celsius (400° C.).

Embodiment 18

The method of Embodiment 17, further comprising applying pressure between the first bonding surface and the second bonding surface in the environment at a temperature less than about four hundred degrees Celsius (400° C.).

Embodiment 19

The method of Embodiment 18, wherein applying pressure between the first bonding surface and the second bonding surface in the environment at a temperature less than about four hundred degrees Celsius (400° C.) comprises applying pressure between the first bonding surface and the second bonding surface in an environment at a temperature less than about two hundred degrees Celsius (200° C.).

Embodiment 20

The method of Embodiment 19, wherein applying pressure between the first bonding surface and the second bonding surface in the environment at a temperature less than about two hundred degrees Celsius (200° C.) comprises applying pressure between the first bonding surface and the second bonding surface in an environment at about room temperature.

Embodiment 21

A method of bonding a first semiconductor structure to a second semiconductor structure, comprising: depositing metal over a first semiconductor structure; removing a portion of the metal deposited over the first semiconductor structure; subjecting a remaining portion of the metal deposited over the first semiconductor structure to a first thermal budget and annealing the remaining portion of the metal deposited over the first semiconductor structure; removing an additional portion of the metal deposited over the first semiconductor structure after annealing the remaining portion of the metal deposited over the first semiconductor structure; directly bonding at least one metal feature of the first semiconductor structure comprising a remaining portion of the metal deposited over the first semiconductor structure to at least one metal feature of a second semiconductor structure to form a bonded metal structure comprising the at least one metal feature of the first semiconductor structure and the at least one metal feature of the second semiconductor structure; and subjecting the bonded metal structure to a second thermal budget and annealing the bonded metal structure, the second thermal budget being less or equal than the first thermal budget.

Embodiment 22

The method of Embodiment 21, wherein subjecting the remaining portion of the metal deposited over the first semiconductor structure to the first thermal budget and annealing the remaining portion of the metal deposited over the first semiconductor structure comprises subjecting the remaining portion of the metal to a first average annealing temperature over a first annealing time period, and wherein subjecting the bonded metal structure to a second thermal budget and annealing the bonded metal structure comprises subjecting the bonded metal structure to a second average annealing temperature over a second annealing time period.

Embodiment 23

The method of Embodiment 22, wherein the first average annealing temperature is higher or equal than the second average annealing temperature.

Embodiment 24

The method of Embodiment 22, wherein the first annealing time period is longer or equal than the second annealing time period.

Embodiment 25

The method of Embodiment 22, wherein the first average annealing temperature is higher than the second average annealing temperature, and wherein the first annealing time period is longer than or equal to the second annealing time period.

Embodiment 26

The method of any one of Embodiments 21 through 25, further comprising annealing the metal deposited over the first semiconductor structure prior to removing the portion of the metal deposited over the first semiconductor structure.

Embodiment 27

The method of any one of Embodiments 21 through 26, wherein removing the portion of the metal deposited over the first semiconductor structure comprises subjecting the first semiconductor structure to a chemical-mechanical polishing process.

Embodiment 28

The method of any one of Embodiments 21 through 27, wherein removing the additional portion of the metal deposited over the first semiconductor structure comprises subjecting the first semiconductor structure to a chemical-mechanical polishing process.

Embodiment 29

The method of any one of Embodiments 21 through 28, wherein directly bonding the at least one metal feature of the first semiconductor structure to the at least one metal feature of the second semiconductor structure comprises an ultra-low temperature direct bonding process.

Embodiment 30

The method of any one of Embodiments 21 through 29, wherein directly bonding the at least one metal feature of the first semiconductor structure to the at least one metal feature of the second semiconductor structure comprises a surface assisted bonding process.

Embodiment 31

The method of any one of Embodiments 21 through 30, wherein directly bonding the at least one metal feature of the first semiconductor structure to the at least one metal feature of the second semiconductor structure comprises abutting a first bonding surface of the at least one metal feature of the first semiconductor structure directly against a second bonding surface of the at least one metal feature of the second semiconductor structure in an environment at a temperature less than about four hundred degrees Celsius (400° C.).

Embodiment 32

The method of Embodiment 31, further comprising applying pressure between the first bonding surface and the second bonding surface in the environment at a temperature less than about four hundred degrees Celsius (400° C.).

Embodiment 33

A method of bonding a first semiconductor structure to a second semiconductor structure, comprising: depositing a metal over a first semiconductor structure and forming at least one void in the metal; directly bonding at least one metal feature of the first semiconductor structure comprising a portion of the metal to at least one metal feature of a second semiconductor structure to form a bonded metal structure comprising the at least one metal feature of the first semiconductor structure and the at least one metal feature of the second semiconductor structure; and annealing the bonded metal structure by subjecting the bonded metal structure to a post-bonding thermal budget and causing the metal of the at least one metal feature of the first semiconductor structure to expand into a space previously occupied by the void in the metal.

Embodiment 34

The method of Embodiment 33, further comprising removing a portion of the metal deposited over the first semiconductor structure, the at least one metal feature of the first semiconductor structure comprising a remaining portion of the metal on the first semiconductor structure.

Embodiment 35

The method of Embodiment 33 or Embodiment 34, further comprising annealing the metal of the at least one metal feature by subjecting the metal of the at least one metal feature to a pre-bonding thermal budget prior to directly bonding the at least one metal feature of the first semiconductor structure to the at least one metal feature of the second semiconductor structure.

Embodiment 36

The method of Embodiment 35, further comprising causing the pre-bonding thermal budget to be equal to or higher than the post-bonding thermal budget.

Embodiment 37

The method of Embodiment 35 or Embodiment 36, wherein annealing the metal of the at least one metal feature by subjecting the metal of the at least one metal feature to a pre-bonding thermal budget comprises annealing the metal deposited over the first semiconductor structure prior to removing the portion of the metal deposited over the first semiconductor structure.

Embodiment 38

The method of Embodiment 37, wherein annealing the metal of the at least one metal feature by subjecting the metal of the at least one metal feature to a pre-bonding thermal budget further comprises annealing the remaining portion of the metal on the first semiconductor structure after removing the portion of the metal deposited over the first semiconductor structure.

Embodiment 39

The method of Embodiment 35 or Embodiment 36, wherein annealing the metal of the at least one metal feature by subjecting the metal of the at least one metal feature to a pre-bonding thermal budget comprises annealing the remaining portion of the metal on the first semiconductor structure after removing the portion of the metal deposited over the first semiconductor structure.

Embodiment 40

The method of any one of Embodiments 33 through 39, wherein causing the metal of the at least one metal feature of the first semiconductor structure to expand into a space previously occupied by the void in the metal comprises reducing a volume of the void.

Embodiment 41

The method of Embodiment 40, wherein reducing a volume of the void comprises eliminating the void.

Embodiment 42

A bonded semiconductor structure formed in accordance with a method as recited in any of Embodiments 1 through 41.

Embodiment 43

A bonded semiconductor structure, comprising: a first semiconductor structure comprising at least one metal feature, the at least one metal feature of the first semiconductor structure having at least one inner surface defining a void within the at least one metal feature of the first semiconductor structure; and a second semiconductor structure comprising at least one metal feature directly bonded to the at least one metal feature of the first semiconductor structure.

Embodiment 44

The bonded semiconductor structure of Embodiment 43, wherein the at least one metal feature of the second semiconductor structure has at least one inner surface defining a void within the at least one metal feature of the second semiconductor structure.

The example embodiments of the disclosure described above do not limit the scope of the invention, since these embodiments are merely examples of embodiments of the invention, which is defined by the scope of the claims and their legal equivalents. Any equivalent embodiments are intended to be within the scope of this invention. Indeed, various modifications of the disclosure, in addition to those shown and described herein, such as alternate useful combinations of the elements described, will become apparent to those skilled in the art from the description. In other words, one or more features of one example embodiment described herein may be combined with one or more features of another example embodiment described herein to provide additional embodiments of the disclosure. Such modifications and embodiments are also intended to fall within the scope of the appended claims.

What is claimed is:

1. A method of directly bonding a first semiconductor structure to a second semiconductor structure, comprising:
    depositing metal over a first semiconductor structure;
    removing a portion of the metal deposited over the first semiconductor structure prior to subjecting the metal deposited over the first semiconductor structure to any annealing process;

subjecting a remaining portion of the metal deposited over the first semiconductor structure to a first thermal budget and annealing the remaining portion of the metal deposited over the first semiconductor structure by subjecting the remaining portion of the metal to a first average annealing temperature over a first annealing time period;

directly bonding at least one metal feature of the first semiconductor structure comprising the remaining portion of the metal deposited over the first semiconductor structure to at least one metal feature of a second semiconductor structure to form a bonded metal structure comprising the at least one metal feature of the first semiconductor structure and the at least one metal feature of the second semiconductor structure; and subjecting the bonded metal structure to a second thermal budget and annealing the bonded metal structure by subjecting the bonded metal structure to a second average annealing temperature over a second annealing time period, the second thermal budget being less than or equal to the first thermal budget.

2. The method of claim 1, wherein the first average annealing temperature is equal to or higher than the second average annealing temperature.

3. The method of claim 1, wherein the first annealing time period is longer than or equal to the second annealing time period.

4. The method of claim 1, wherein the first average annealing temperature is higher than or equal to the second average annealing temperature, and wherein the first annealing time period is longer than or equal to the second annealing time period.

5. The method of claim 1, wherein removing the portion of the metal deposited over the first semiconductor structure comprises subjecting the first semiconductor structure to a chemical-mechanical polishing process.

6. The method of claim 1, further comprising selecting the metal deposited over the first semiconductor structure to comprise copper or a copper alloy.

7. The method of claim 1, further comprising forming a cap layer at a surface of the at least one metal feature of the first semiconductor structure prior to directly bonding the at least one metal feature of the first semiconductor structure to the at least one metal feature of the second semiconductor structure.

8. The method of claim 7, wherein forming the cap layer comprises forming the cap layer to comprise a metal silicide.

9. The method of claim 7, wherein forming the cap layer comprises forming the cap layer to comprise a metal, silicon, and nitrogen.

10. The method of claim 7, wherein forming the cap layer comprises forming the cap layer to comprise a metal alloy.

11. The method of claim 10, further comprising forming the cap layer to comprise CoWP.

12. The method of claim 7, further comprising forming the cap layer to have an average thickness of about ten nanometers (10 nm) or less.

13. The method of claim 1, wherein directly bonding the at least one metal feature of the first semiconductor structure to the at least one metal feature of the second semiconductor structure comprises an ultra-low temperature direct bonding process.

14. The method of claim 1, wherein directly bonding the at least one metal feature of the first semiconductor structure to the at least one metal feature of the second semiconductor structure comprises a surface assisted bonding process.

15. The method of claim 1, wherein directly bonding the at least one metal feature of the first semiconductor structure to the at least one metal feature of the second semiconductor structure comprises abutting a first bonding surface of the at least one metal feature of the first semiconductor structure directly against a second bonding surface of the at least one metal feature of the second semiconductor structure in an environment at a temperature less than about four hundred degrees Celsius (400° C.).

16. The method of claim 15, further comprising applying pressure between the first bonding surface and the second bonding surface in the environment at a temperature less than about four hundred degrees Celsius (400° C.).

17. The method of claim 16, wherein applying pressure between the first bonding surface and the second bonding surface in the environment at a temperature less than about four hundred degrees Celsius (400° C.) comprises applying pressure between the first bonding surface and the second bonding surface in an environment at a temperature less than about two hundred degrees Celsius (200° C.).

18. The method of claim 17, wherein applying pressure between the first bonding surface and the second bonding surface in the environment at a temperature less than about two hundred degrees Celsius (200° C.) comprises applying pressure between the first bonding surface and the second bonding surface in an environment at about room temperature.

19. A method of bonding a first semiconductor structure to a second semiconductor structure, comprising:

depositing metal over a first semiconductor structure;

removing a portion of the metal deposited over the first semiconductor structure prior to subjecting the metal deposited over the first semiconductor structure to any annealing process;

subjecting a remaining portion of the metal deposited over the first semiconductor structure to a first thermal budget and annealing the remaining portion of the metal deposited over the first semiconductor structure by subjecting the remaining portion of the metal to a first average annealing temperature over a first annealing time period;

removing an additional portion of the metal deposited over the first semiconductor structure after annealing the remaining portion of the metal deposited over the first semiconductor structure;

directly bonding at least one metal feature of the first semiconductor structure comprising a remaining portion of the metal deposited over the first semiconductor structure to at least one metal feature of a second semiconductor structure to form a bonded metal structure comprising the at least one metal feature of the first semiconductor structure and the at least one metal feature of the second semiconductor structure; and subjecting the bonded metal structure to a second thermal budget and annealing the bonded metal structure by subjecting the bonded metal structure to a second average annealing temperature over a second annealing time period, the second thermal budget being less than or equal to the first thermal budget.

20. The method of claim 19, wherein the first average annealing temperature is higher than or equal to the second average annealing temperature.

21. The method of claim 19, wherein the first annealing time period is longer than or equal to the second annealing time period.

22. The method of claim 19, wherein the first average annealing temperature is higher than or equal to the second average annealing temperature, and wherein the first annealing time period is longer than or equal to the second annealing time period.

23. The method of claim 19, wherein removing the portion of the metal deposited over the first semiconductor structure comprises subjecting the first semiconductor structure to a chemical-mechanical polishing process.

24. The method of claim 19, wherein removing the additional portion of the metal deposited over the first semiconductor structure comprises subjecting the first semiconductor structure to a chemical-mechanical polishing process.

25. The method of claim 19, wherein directly bonding the at least one metal feature of the first semiconductor structure to the at least one metal feature of the second semiconductor structure comprises an ultra-low temperature direct bonding process.

26. The method of claim 19, wherein directly bonding the at least one metal feature of the first semiconductor structure to the at least one metal feature of the second semiconductor structure comprises a surface assisted bonding process.

27. The method of claim 19, wherein directly bonding the at least one metal feature of the first semiconductor structure to the at least one metal feature of the second semiconductor structure comprises abutting a first bonding surface of the at least one metal feature of the first semiconductor structure directly against a second bonding surface of the at least one metal feature of the second semiconductor structure in an environment at a temperature less than about four hundred degrees Celsius (400° C.).

28. The method of claim 27, further comprising applying pressure between the first bonding surface and the second bonding surface in the environment at a temperature less than about four hundred degrees Celsius (400° C.).

* * * * *